(12) United States Patent
Hirairi

(10) Patent No.: US 6,232,800 B1
(45) Date of Patent: May 15, 2001

(54) DIFFERENTIAL SENSE AMPLIFIER CIRCUIT AND DYNAMIC LOGIC CIRCUIT USING THE SAME

(75) Inventor: Koji Hirairi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/513,475

(22) Filed: Feb. 25, 2000

(30) Foreign Application Priority Data

Dec. 22, 1999 (JP) .................................................. 11-365661

(51) Int. Cl.[7] .................................................. G01R 19/00
(52) U.S. Cl. .................................. 327/55; 327/52; 327/57
(58) Field of Search ........................................... 327/52–57

(56) References Cited

U.S. PATENT DOCUMENTS

| | | | | |
|---|---|---|---|---|
| 6,130,560 | * | 10/2000 | Sato | 327/55 |
| 6,137,319 | * | 10/2000 | Krishnamurthy et al. | 327/55 |
| 6,147,514 | * | 11/2000 | Shiratake | 327/55 |

OTHER PUBLICATIONS

IEE Journal of Solid–State Circuits, vol. 31, No. 7, Jul. 1996; "Differential Current Switch Logic: A Low Power DCVS Logic Family".

* cited by examiner

Primary Examiner—Kenneth B. Wells
(74) Attorney, Agent, or Firm—Ronald P. Kananen; Rader, Fishman & Grauer

(57) ABSTRACT

A dynamic logic circuit where a duality logic tree is connected to a sense amplifier through a switch, which reduces the power consumption and suppresses coupling noise by controlling the connection of the logic tree and the sense amplifier by the voltages of the input and output nodes of the sense amplifier.

50 Claims, 31 Drawing Sheets

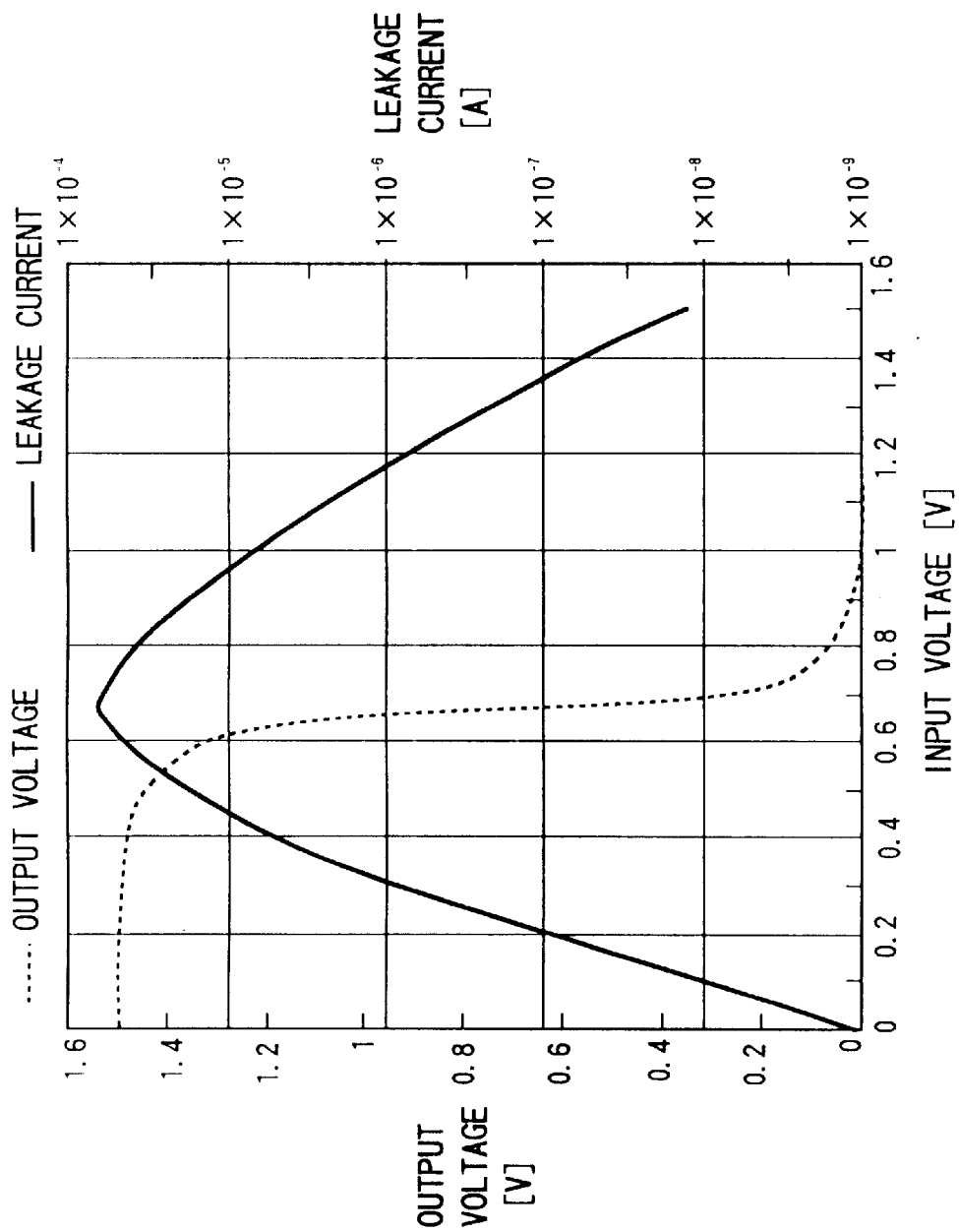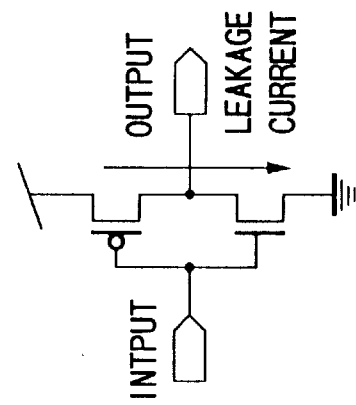

FIG.14

|  | FORMAT OF LOGIC TREE (HEIGHT OF LOGIC TREE) | | | |
|---|---|---|---|---|
|  | 2-INPUT EXOR | 3-INPUT EXOR | 4-INPUT EXOR | 5-INPUT EXOR |
| DCSL3 | > 1.50 | > 1.50 | > 1.50 | > 1.50 |
| N2 TYPE | 0.97 | 1.08 | 1.20 | 1.46 |
| P2 TYPE | ≤ 0.70 | ≤ 0.70 | ≤ 0.70 | 0.72 |
| N3 TYPE | 1.04 | 1.13 | 1.23 | > 1.50 |
| P3 TYPE | ≤ 0.70 | ≤ 0.70 | ≤ 0.70 | ≤ 0.70 |

DIFFERENTIAL SENSE AMPLIFIER CIRCUIT AND DYNAMIC LOGIC CIRCUIT USING THE SAME

BACKGROUND OF THE INVENTION

1. Field of the Invention

The present invention relates to a differential sense amplifier in a CMOS semiconductor integrated circuit and to a dynamic logic circuit applying the same.

Here, a "dynamic logic circuit" means a logic circuit of a type which alternates between two phases, that is, an "idle phase" where it initializes the potential of internal nodes and a "working phase" where it evaluates the logic according to an input signal and defines the potential of an output node, according to a clock or other control signal.

2. Description of the Related Art

FIG. 1 is a circuit diagram of an example of the configuration of a conventional differential sense amplifier circuit (refer to Dinesh Somaseckhar and Kaushik Roy, "Differential Current Switch Logic: A Low Power DCVS Logic Family", IEEE JSSC, vol. 31, no. 7, pp. 981–991, July 1996).

This differential sense amplifier circuit 10 has, as shown in FIG. 1, p-channel MOS (PMOS) transistors PT11 to PT13, n-channel MOS (NMOS) transistors NT11 to NT15, logic Input terminals TF and TFX, logic output terminals TH and THX, a clock input terminal TCLKX, and a completion signal use output terminal TDONE indicating definition of the logic.

A source of the PMOS transistor PT11 is connected to a supply line of a power supply voltage $V_{DD}$, while a drain is connected to sources of the PHOS transistors PT12 and PT13 and the completion signal use output terminal TDONE.

The drains and gates of the PMOS transistor PT12 and the NMOS transistor NT11 are connected to each other to configure an inverter INV11.

An output node ND11 of the Inverter INV11 is configured by a connection point of the PMOS transistor PT12 and the NMOS transistor NT11, while an input node ND12 of the inverter INV11 is configured by the connection point of the gates.

Similarly, the drains and the gates of the PMOS transistor PT13 and the NMOS transistor NT12 are connected to each other to configure an inverter INV12.

An output node ND13 of the inverter INV12 is configured by the connection point of the drains of the PMOS transistor PT13 and the NMOS transistor NT12, while an input node ND14 of the inverter INV12 is configured by the connection point of the gates.

The sources of the NMOS transistors NT11 and NT12 are grounded.

The output node ND11 of the inverter INV11 is connected to the input node ND14 of the inverter INV12 and the logic output terminal TH, while the output node ND13 of the inverter INV12 is connected to the input node ND12 of the inverter INV11 and the logic output terminal HX.

Further, the NHOS transistor NT15 Is connected between the input node ND12 of the inverter INV11 and the input node ND14 of the Inverter INV12, In other words, between the gate of the NMOS transistor NT11 and the gate of the NMOS transistor NT12.

Further, the NMOS transistor NT13 is connected between the logic output terminal TH and the logic input terminal TF, while the NMOS transistor NT14 is connected between the logic output terminal THX and the logic input terminal TFX.

Further, the gate of the PMOS transistor PT11 and the gate of the NMOS transistor NT15 are connected to the clock input terminal TCLKX, the gate of the NMOS transistor NT13 is connected to the input node ND12 of the inverter INV11 and the gate of the NMOS transistor NT14 Is connected to the input node ND14 of the inverter INV12.

The differential sense amplifier circuit 10 having the above configuration is a DCSL (differential current switch logic) 3 type sense amplifier circuit described in the above document.

Below, an explanation will be made of the principle of the operation of this differential sense amplifier circuit 10 in relation to FIG. 2 and FIG. 3 showing simulation waveforms.

Note that, here, a base point at which the phase switches from the idle phase to the working phase Is assumed to be the rising edge of a clock CLK. In a sense amplifier circuit of the DCSL3 type, the trailing edge of the control signal is made the base point to the working phase, therefore, in the following explanation, an inverted signal CLK_X of the clock will be introduced and used in the explanation.

FIG. 2 is a view of the operation waveform (simulation result) of a sense amplifier circuit of the DCSL3 type at the rising of the clock CLK, that is, at the falling of the clock inverted signal CLK_X. Further, in other words, FIG. 2 shows a process by which the phase switches from the idle phase to the working phase at the trailing edge of the clock CLK_X and by which the logic is therefore defined.

Further, FIG. 3 is a view of the operation waveform (simulation result) of a sense amplifier circuit of the DCSL3 type atbthe falling of the clock CLK, that is, at the rising of the clock inverted signal CLK_X.

In FIG. 2 and FIG. 3, the abscissas indicate the time, and the ordinates indicate the voltage.

As shown in FIG. 2, in the differential sense amplifier 10, when the clock inverted signal CLK_X has a logic "1" and the phase is the idle phase, the logic outputs H and H_X do not become a complete potential 0V, but rise by exactly an amount of a threshold value of the MOS.

The levels of these logic outputs H and H_X, that is, the potentials of the logic output terminals TH and THX, are also transferred to gate electrodes of the NMOS transistors NT13 and NT14, whereby both NMOS transistors NT13 and NT14 are cut off.

For this reason, a state where a not illustrated logic tree connected to the logic input terminals TF and TFX and the sense amplifier circuit 10 are electrically out off is exhibited.

Then, when the clock inverted signal CLK_X becomes a logic "0" and the phase is the working phase, the PMOS transistor PT11 becomes ON, a current flows through the PMOS transistors PT12 and PT13, and the potentials of the logic output terminals TH and THX start to rise. The potentials of the logic output terminals TH and THX at this node are also transferred to the gate electrodes of the NMOS transistors NT13 and NT14, therefore both NMOS transistors NT13 and NT14 start to become ON and start to pass current from the sense amplifier to the logic input terminals TF and TFX.

As will be explained later, there is a difference between the currents flowing to the logic input terminals TF and TFX. The sense amplifier configured by the PMOS transistors PT11 to PT13 and the NMOS transistors NT11 and NT12 increases the potential difference between the logic outputs H and H_X according to that difference to define the logic.

At this time, either of the logic outputs H and H_X becomes the logic "0" without fail. In the example Ln the figure, the logic output H_X has become the logic "0".

For this reason, the NMOS transistor NT13 having a connection relationship with respect to the logic output terminal THX becomes cut off. This NMOS transistor NT13 is a switch for controlling the connection with respect to the logic input terminal TF.

Accordingly, the current flowing into the logic input terminal TF can be suppressed to the required minimum limit.

When the clock inverted signal CLK_X becomes the logic "1" and the phase is the idle phase, the NMOS transistor NT15 becomes ON.

By this, the charge existing on an output line including the terminal TH of the logic output H flows onto the output line including the terminal THX of the logic output H_X through the NMOS transistor NT15, whereby the potentials of the two logic output terminals TH and THX become equal.

The potential at this instant is slightly larger than the threshold value of the MOS, therefore a state where the NMOS transistors NT11 and NT12 weakly become ON is exhibited. As a result, the current is slightly discharged through them. Accordingly, at the next instant, the potentials of the logic output terminals TH and THX become almost equal to the threshold value of the MOS.

A duality logic tree 20 is configured by for example NMOS transistors NT21 to NT34 is connected to the logic input terminals TF and TFX of the sense amplifier circuit 10 of the DCSL3 type having such a configuration and function as shown in FIG. 4, whereby a dynamic logic circuit is realized.

A "dynamic logic oircuit", as explained above, means a logic circuit of a type alternating between two phases, that is, an "idle phase" where it initializes the potential of the internal nodes and the "working phase" where it evaluates the logic function according to an input signal and defines the potential of the output node, according to a control signal. Generally, a clock is used for the control signal.

As explained above, in the sense amplifier circuit 10 of the DCSL3 type, in the idle phase, the internal nodes, that is, the logic outputs H and H_X, are initialized to the logic "0".

In the working phase for judging the logic, the NMOS transistors NT13 and NT14 of FIG. 1 become a conductive state and the current flows to the logic tree 20 through the PMOS transistors PT11 to PT13.

At this time, either of the logic inputs F and F_X always has a route reaching the ground, while the other is cut off on the middle of the route.

Accordingly, a difference arises in magnitude between the current flowing to the logic input terminal TF and the current flowing to the logic input terminal TFX.

In FIG. 1, the sense amplifier configured by the PMOS transistors PT11 to PT13 and the NMOS transistors NT11 and NT12 increases the potential difference between the logic outputs (nodes) H and H_X according to the difference of the currents and finally reaches and defines the logic potential.

However, the differential sense amplifier circuit 10 of the above DCSL3 type suffers from the following three problems.

A first problem of the DCSL3 type is that the completion signal DONE indicating the definition of the logic is not complete. An explanation will be made of this first problem in relation to FIG. 5.

FIG. 5 is a view of the state of the completion signal DONE when the phase switches from the idle phase to the working phase.

As apparent from FIG. 5, the completion signal DONE in the idle phase is much larger than the threshold value of the NMOS transistor and no longer means "0".

Further, the timing at which the phase becomes the working phase and the completion signal DONE rises is clearly different from the timing of definition of the logic outputs H and H_X.

Accordingly, there is an apprehension that a later logic circuit configured so as to refer to the completion signal DONE will end up malfunctioning.

A second problem of the DCSL3 type is that the potentials of the logic outputs H and H_X in the idle phase do not become completely 0V. As mentioned above, the potentials become close to the threshold value of the NMOS transistor.

Even in an MOS in which potential not more than the threshold value is added to the gate electrode and which becomes out off, a drain current actually flows. In general, this will be referred to as a leakage current (or cutoff leak). It has been known that the amount of the current changes exponentially with respect to the gate potential.

A concrete example thereof will be shown in FIGS. 6A and 6B.

FIGS. 6A and 6B are an explanatory view of the leakage current of a CMOS inverter, in which FIG. 6A is a circuit diagram of a simulation subject, and FIG. 6B is a view of the simulation results, that is, the output voltage and leakage current versus the input voltage characteristics.

Specifically, FIG. 6B collects the output voltages and the leakage currents when the potentials of the input terminals are changed from 0V to the current voltage (1.5V) with respect to the CMOS inverter as shown in FIG. 6A of the same figure.

Here, from FIG. 2 etc., the potentials of the outputs H and H_X in the idle phase are regarded to be in the vicinity of 0.2V.

According to FIG. 6B, the leakage current flowing when the input voltage is 0.2V is 100 times that when the input voltage is 0.0V.

Accordingly, in a differential sense amplifier circuit of the DCSL3 type, there is a problem that the power consumption becomes large when the clrcuit is stopped.

A third problem of the DCSL3 type is the malfunction of the sense amplifier due to coupling noise.

A parasitic capacity component exists between two interconnections which are extremely close in distance. If potential fluctuation occurs in one interconnection, a displacement current proportional to a time differentiation of the fluctuated potential difference flows to the adjacent interconnection through the parasitic capacitance and causes a potential fluctuation. Such an improper potential fluctuation is referred to as coupling noise.

FIG. 7 is a view of a model for evaluation of the resistance to coupling noise.

In an evaluation model 30, existence of parasitic capacitances C31 to C40 is assumed at the periphery of the sense amplifier circuit 10, so noise is given from noise voltage sources 31 to 35 through nodes NZ1 to NZ5 to the nodes H, H_X, F, and F_X inside the sense amplifier.

For example, if a rising signal is input to the node NZ1, the voltage of the node H slightly rises under its influence.

FIG. 8 is a view of the operation waveform when applying this model to a sense amplifier circuit 10 of the DCSL3 type and where a falling signal is given to the node NZ1 at a timing about the same as the falling of the clock inverted signal CLK_X.

The condition of the input signal at this time is the same as that in FIG. 2. In normal operation, H becomes equal to 1 and H_X becomes equal to 0.

In FIG. 8, however, H becomes equal to 0 and H_X becomes equal to 1. In the figure, a phenomenon where the potential of the logic output H is lower than the potential of the logic output H_X is seen during the period during which the node NZ1 falls.

This does not occur in FIG. 2 in which no noise is given. In FIG. 2, during the period in which the voltage of the logic output H must be equal to that of H_X in FIG. 2, the potential of the logic output H becomes lower, though only slightly, under the influence of the node NZ1 in FIG. 8.

The sense amplifier circuit 10 increases this improperly occurring potential difference and ends up defining an erroneous logic value.

The fact that the circuit will malfunction upon receipt of a falling signal from the outside at almost the same timing as when the clock inverted signal CLK_X falls suggests the possibility of an occurrence of a malfunction by the falling of the clock inverted signal CLK_X caused in an adjacent cell employing the DCSL3 type.

Such an unstable circuit is not practical.

SUMMARY OF THE INVENTION

The present invention was made in consideration with such a circumstance and has as an object thereof to provide a practical differential sense amplifier capable of generating a completion signal not causing a malfunction of a later logic circuit and capable of reducing the power consumption when the circuit is stopped and free from apprehension of occurrence of a malfunction due to coupling noise and a dynamic logic circuit using the same.

According to a first aspect of the present invention, there is provided a differential sense amplifier circuit alternating between two phases of an idle phase and an working phase according to a control signal, comprising a first logic input terminal, a second logic input terminal, a first logic output terminal, a second logic output terminal, a sense amplifier which has a first inverter, and a second inverter, in which the output of the first inverter and the input of the second inverter are connected, a connection point thereof is connected to the first logic output terminal, the input of the first inverter and the output of the second inverter are connected, and the connection point thereof is connected to the second logic output terminal, and which operates upon receipt of the control signal indicating the working phase to define logic potentials of the first logic output and the second logic output at a different first level and second level according to a difference of conduction resistances possessed by the first logic input and the second logic input, an initializing means for initializing the first logic input terminal and the second logic input terminal at a reference potential upon receipt of the control signal indicating the idle phase, a first switching means for electrically connecting or cutting off the first logic input terminal and the first logic output terminal according to the potential of the control terminal, a second switching means for electrically connecting or cutting off the second logic input terminal and the second logic output terminal according to the potential of the control terminal, and a connection controlling means which has a first setting means for setting the potential of the control node connected to the control terminals of the first switching means and the second switching means to a potential that at least can connect two terminals to which the first and second switching means are connected upon receipt of the control signal indicating the idle phase, and a second setting means for setting the potential of the control node to a potential that at least can cut off the two terminals to which the first and second switching means are connected according to the potential of the first logic output terminal or the second logic output terminal at the time of the working phase.

Further, in the present invention, the initializing means includes a first switch element which is connected between the first logic output terminal and the reference potential and becomes conductive by receiving the control signal indicating the idle phase at its control terminal and a second switch means which is connected between the second logic output terminal and the reference potential and becomes conductive by receiving the control signal indicating the idle phase at its control terminal.

Further, in the present invention, the first setting means of the connection controlling means includes a first switch element which is connected between a first power supply potential capable of bringing the first switching means and the second switching means into a connection state and the control node and becomes conductive by receiving the control signal indicating the idle phase at its control terminal and the second setting means includes a second switch element which is connected between a second power supply potential capable of bringing the first switching means and the second switching means into a cutoff state and the control node, has a control terminal which is connected to the first logic output terminal, and becomes conductive when the first logic output potential is at the first level, and a third switch element which is connected between the second power supply potential and the control node, has a control terminal which is connected to the second logic output terminal, and becomes conductive when the second logic output potential is at the first level.

Further, in the present invention, the first setting means of the connection controlling means includes a third switch element which is connected between a first power supply potential capable of bringing the first switching means and the second switching means into a connection state and the control node and becomes conductive by receiving the control signal indicating the idle phase at its control terminal and the second setting means includes a fourth switch element which is connected between a second power supply potential capable of bringing the first switching means and the second switching means into the cutoff state and the control node, has a control terminal which is connected to the first logic output terminal, and becomes conductive when the first logic output potential is at the first level, and a fifth switch element which is connected between the second power supply potential and the control node, has a control terminal which is connected to the second logic output terminal, and becomes conductive when the second logic output potential is at the first level.

Further, in the present invention, the first setting means of the connection controlling means includes a first switch element which is connected between a first power supply potential capable of bringing the first switching means and the second switching means into a connection state and the control node and becomes conductive by receiving the control signal indicating the idle phase at its control terminal and the second setting means includes a second switch element which is connected between an intermediate node and the control node, has a control terminal which is connected to the first logic output terminal, and becomes conductive when the first logic output potential is at the first level, a third switch element which is connected between the intermediate node and the control node, has a control terminal which is connected to the second logic output node, and becomes conductive when the second logic output potential is at the first level, and a fourth switch element which is connected between a second power supply potential capable of bringing the first switching means and the second switching means into the cutoff state and an intermediate node, is held in a nonconductive state when the first switch element becomes conductive, and becomes conductive when the first switch element is held in the nonconductive state.

Further, in the present invention, the first setting means of the connection controlling means includes a third switch element which is connected between a first power supply potential capable of bringing the first switching means and the second switching means into the connection state and the control node and becomes conductive by receiving the control signal indicating the idle phase at its control terminal and the second setting means includes a fourth switch element which is connected between the intermediate node and the control node, has a control terminal which is connected to the first logic output terminal, and becomes conductive when the first logic output potential is at the first level, a fifth switch element which is connected between the intermediate node and the control node, has a control terminal which is connected to the second logic output node, and becomes conductive when the second logic output potential is at the first level, and a sixth switch element which is connected between a second power supply potential capable of bringing the first switching means and the second switching means into the cutoff state and, the intermediate node, is held in the nonconductive state when the third switch element becomes conductive, and becomes conductive when the third switch element is held in the nonconductive state.

Further, in the present invention, the first switch element or the third switch element of the first setting means includes a charge effect transistor of an n-channel with a gate which is connected to the input terminal of the control signal.

Further, in the present invention, the first switch element or the third switch element of the first setting means includes a charge effect transistor of a p-channel with a gate which is connected to the input terminal of the control signal.

According to a second aspect of the present invention, there is provided a differential sense amplifier circuit alternating between two phases of an idle phase and a working phase according to a control signal, comprising a first logic input terminal, a second logic input terminal, a first logic output terminal, a second logic output terminal, a sense amplifier which has a first inverter, and a second inverter, in which the output of the first inverter and the input of the second inverter are connected, the connection point thereof is connected to the first logic output terminal, the input of the first inverter and the output of the second inverter are connected, and the connection point thereof is connected to the second logic output terminal, and which operates upon receipt of a control signal indicating the working phase to define logic potentials of the first logic output and the second logic output at a different first level and second level according to the difference of conduction resistances possessed by the first logic input and the second logic input, an initializing means for connecting the input of the first inverter and the input of the second inverter upon receipt of a control signal indicating the idle phase, a first switching means for electrically connecting or cutting off the first logic input terminal and the first logic output terminal according to the potential of the control terminal, a second switching means for electrically connecting or cutting off the second logic input terminal and the second logic output terminal according to the potential of the control terminal, and a connection controlling means which has a first setting means for setting the potential of the control node connected to the control terminals of the first switching means and the second switching means to a potential that at least can connect two terminals to which the first and second switching means are connected upon receipt of the control signal indicating the idle phase, and a second setting means for setting the potential of the control node to a potential that at least can cut off the two terminals to which the first and second switching means are connected according to the potential of the first logic output terminal or the second logic output terminal at the time of the working phase.

Further, in the present invention, the initializing means includes a first switch element which is connected between the input of the first inverter and the input of the second inverter and becomes conductive upon receipt of the control signal indicating the idle phase at its control terminal.

Further, in the present invention, the first setting means of the connection controlling means includes a first switch element which is connected between a first power supply potential capable of bringing the first switching means and the second switching means into the connection state and the control node and becomes conductive by receiving the control signal indicating the idle phase at its control terminal and the second setting means includes a second switch element which is connected between a second power supply potential capable of bringing the first switching means and the second switching means into the cutoff state and the control node, has a control terminal which is connected to the first logic output terminal, and becomes conductive when the first logic output potential is at the first level, and a third switch element which is connected between the second power supply potential and the control node, has a control terminal which is connected to the second logic output terminal, and becomes conductive when the second logic output potential is at the first level.

Further, in the present invention, the first setting means of the connection controlling means includes a second switch element which is connected between a first power supply potential capable of bringing the first switching means and the second switching means into the connection state and the control node and becomes conductive by receiving the control signal indicating the idle phase at its control terminal and the second setting means includes a third switch element which is connected between a second power supply potential capable of bringing the first switching means and the second switching means into the cutoff state and the control node, has a control terminal which is connected to the first logic output terminal, and becomes conductive when the first logic output potential is at the first level, and a fourth switch element which is connected between the second power supply potential and the control node, has a control terminal which is connected to the second logic output terminal, and becomes conductive when the second logic output potential is at the first level.

Further, in the present invention, the first setting means of the connection controlling means includes a first switch element which is connected between a first power supply potential capable of bringing the first switching means and the second switching means into this connection state and the control node and becomes conductive by receiving the control signal indicating the idle phase at its control terminal and the second setting means includes a second switch element which is connected between an intermediate node and the control node, has a control terminal which is connected to the first logic output terminal, and becomes conductive when the first logic output potential is at the first level, a third switch element which is connected between the intermediate node and the control node, has a control terminal which is connected to the second logic output node, and becomes conductive when the second logic output potential is at the first level, and a fourth switch element which is connected between a second power supply potential capable of bringing the first switching means and the second switching means into the cutoff state and the intermediate node, is held in the nonconductive states when the first switch element becomes conductive, and becomes conductive when the first switch element is held in the nonconductive state.

Further, in the present invention, the first setting means of the connection controlling means includes a second switch element which is connected between a first power supply potential capable of bringing the first switching means and the second switching means into the connection state and the control node and becomes conductive by receiving the control signal indicating the idle phase at its control terminal and the second setting means includes a third switch element which is connected between the intermediate node and the control node, has a control terminal which is connected to the first logic output terminal, and becomes conductive when the first logic output potential is at the first level, a fourth switch element which is connected between the intermediate node and the control node, has a control terminal which is connected to the second logic output node, and becomes conductive when the second logic output potential is at the first level, and a fifth switch element which is connected between a second power supply potential capable of bringing the first switching means and the second switching means into the cutoff state and the intermediate node, is held in the nonconductive state, when the second switch element becomes conductive, and becomes conductive when the second switch element is held in the nonconductive state.

Further, in the present invention, the first switch element or the second switch element of the first setting means includes a charge effect transistor of an n-channel with a gate which is connected to the input terminal of the control signal.

Further, in the present invention, the first switch element or the second switch element of the first setting means includes a charge effect transistor of a p-channel with a gate which is connected to the input terminal of the control signal.

According to a third aspect of the present invention, there is provided a differential sense amplifier circuit alternating between two phases of an idle phase and a working phase according to a control signal, having a first logic input terminal, a second logic input terminal, a first logic output terminal, a second logic output terminal, a sense amplifier which has a first inverter, and a second inverter, in which the output of the first inverter and the input of the second inverter are connected, the connection point thereof is connected to the first logic output terminal, the input of the first inverter and the output of the second inverter are connected, and the connection point thereof is connected to the second logic output terminal, and which operates upon receipt of a control signal indicating the working phase to define logic potentials of the first logic output and the second logic output at a different first level and second level according to the difference of conduction resistances possessed by the first logic input and the second logic input, an initializing means for connecting the input of the first inverter and the input of the second inverter upon receipt of a control signal indicating the idle phase, a first switching means for electrically connecting or cutting off the first logic input terminal and the first logic output terminal according to the potential of the control terminal, a second switching means for electrically connecting or cutting off the second logic input terminal and the second logic output terminal according to the potential of the control terminal, and a connection controlling means which has a first setting means for setting the potential of the control node connected to the control terminals of the first switching means and the second switching means to a potential that at least can connect two terminals to which the first and second switching means are connected upon receipt of at least one of the potentials of the first logic output terminal and the second logic output terminal at the time of the idle phase, and a second setting means for setting the potential of the control node to a potential that at least can cut off the two terminals to which the first and second switching means are connected according to the potential of the first logic output terminal or the second logic output terminal at the time of the working phase.

Further, in the present invention, the initializing means includes a first switch element which is connected between the input of the first inverter and the input of the second inverter and becomes conductive upon receipt of a control signal indicating the idle phase at its control terminal.

Further, in the present invention, the first setting means of the connection controlling means includes a first switch element and a second switch element which are connected in series between a first power supply potential capable of bringing the first switching means and the second switching means into the connection state and the control node and become conductive by receiving the potential of the first logic output terminal and the potential of the second logic output terminal at the time of the idle phase at their control terminals and the second setting means includes a third switch element which is connected between a second power supply potential capable of bringing the first switching means and the second switching means into the cutoff state and the control node, has a control terminal which is connected to the first logic output terminal, and becomes conductive when the first logic output potential is at the first level, and a fourth switch element which is connected between the second power supply potential and the control node, has a control terminal which is connected to the second logic output terminal, and becomes conductive when the second logic output potential is at the first level.

Further, in the present invention, the first setting means of the connection controlling means includes a second switch element and a third switch element which are connected in series between a first power supply potential capable of bringing the first switching means and the second switching means into the connection state and the control node and become conductive by receiving the voltage of the first logic output terminal and the voltage of the second logic output terminal at the time of the idle phase at their control terminals and the second setting means includes a fourth switch element which is connected between a second power supply potential capable of bringing the first switching means and the second switching means into the cutoff state and the control node, has a control terminal which is connected to the first logic output terminal, and becomes conductive when the first logic output potential is at the first level, and a fifth switch element which is connected between the second power supply potential and the control node, has a control terminal which is connected to the second logic output terminal, and becomes conductive when the second logic output potential is at the first level.

Further, in the present invention, the first and the second switch elements of the first setting means each include a charge effect transistor of the p-channel with a gate which is connected to the input terminal of the control signal.

Further, in the present invention, the connection controlling means outputs a completion signal indicating that the logic is defined from the control node.

According to a fourth aspect of the present invention, there is provided a dynamic logical circuit alternating between two phases of an idle phase and a working phase according to a control signal, comprising a differential sense amplifier circuit having a first logic input terminal, a second logic input terminal, a first logic output terminal, a second logic output terminal, a sense amplifier which has a first inverter, and a second inverter, in which the output of the first inverter and the input of the second inverter are connected, the connection point thereof is connected to the first logic output terminal, the input of the first inverter and the output of the second inverter are connected, and the connection point thereof is connected to the second logic output terminal and which operates upon receipt of a control signal indicating the working phase to define logic potentials of the first logic output and the second logic output at a different first level and second level according to the difference of conduction resistances possessed by the first logic input and the second logic input, an initializing means for initializing the first logic input terminal and the second logic input terminal at a reference potential upon receipt of a control signal indicating the idle phase, a first switching means for electrically connecting or cutting off the first logic input terminal and the first logic output terminal according to the potential of the control terminal, a second switching means for electrically connecting or cutting off the second logic input terminal and the second logic output terminal according to the potential of the control terminal, and a connection controlling means which has a first setting means for setting the potential of the control node connected to the control terminals of the first switching means and the second switching means to a potential that at least can connect two terminals to which the first and second switching means are connected upon receipt of a control signal indicating the idle phase, and the second setting means for setting the potential of the control node to a potential that at least can cut off the two terminals to which the first and second switching means are connected according to the potential of the first logic output terminal or the second logic output terminal at the time of the working phase, and a two rail type logic tree having two rails connected to the first logic input terminal and the second logic input terminal of the differential sense amplifier circuit, in which only one rail forms a route reaching the reference potential according to an input signal.

According to a fifth aspect of the present invention, there is provided a dynamic logical circuit alternating between two phases of an idle phase and a working phase according to a control signal, provided with a differential sense amplifier circuit having a first logic input terminal, a second logic input terminal, a first logic output terminal, a second logic output terminal, a sense amplifier which has a first inverter, and a second inverter, in which the output of the first inverter and the input of the second inverter are connected, the connection point thereof is connected to the first logic output terminal, the input of the first inverter and the output of the second inverter are connected, and the connection point thereof is connected to the second logic output terminal and which operates upon receipt of a control signal indicating the working phase to define logic potentials of the first logic output and the second logic output at a different first level and second level according to the difference of conduction resistances possessed by the first logic input and the second logic input, an initializing means for connecting the input of the first inverter and the input of the second inverter upon receipt of a control signal indicating the idle phase, a first switching means for electrically connecting or cutting off the first logic input terminal and the first logic output terminal according to the potential of the control terminal, a second switching means for electrically connecting or cutting off the second logic input terminal and the second logic output terminal according to the potential of the control terminal, and a connection controlling means which has a first setting means for setting the potential of the control node connected to the control terminals of the first switching means and the second switching means to a potential that at least can connect two terminals to which the first and second switching means are connected upon receipt of a control signal indicating the idle phase, and a second setting means for setting the potential of the control node to a potential that at least can cut off the two terminals to which the first and second switching means are connected according to the potential of the first logic output terminal or the second logic output terminal at the time of the working phase, and a two rail type logic tree having two rails connected to the first logic input terminal and the second logic input terminal of the differential sense amplifier circuit, in which only one rail forms a route, reaching the reference potential according to an input signal.

According to a sixth aspect of the present invention, there is provided a dynamic logical circuit alternating between two phases of an idle phase and a working phase according to a control signal, provided with a differential sense amplifier circuit having a first logic input terminal, a second logic input terminal, a first logic output terminal, a second logic output terminal, a sense amplifier which has a first inverter, and a second inverter, in which the output of the first inverter and the input of the second inverter are connected, the connection point thereof is connected to the first logic output terminal, the input of the first inverter and the output of the second inverter are connected, and the connection point thereof is connected to the second logic output terminal and which operates upon receipt of a control signal indicating the working phase to define logic potentials of the first logic output and the second logic output at a different first level and second level according to the difference of conduction resistances possessed by the first logic input and the second logic input, an initializing means for connecting the input of the first inverter and the input of the second inverter upon receipt of a control signal indicating the idle phase, a first switching means for electrically connecting or cutting off the first logic input terminal and the first logic output terminal according to the potential of the control terminal, a second switching means for electrically connecting or cutting off the second logic input terminal and the second logic output terminal according to the potential of the control terminal, and a connection controlling means which has a first setting means for setting the potential of the control node connected to the control terminals of the first switching means and the second switching means to a potential that at least can connect two terminals to which the first and second switching means are connected upon receipt of at least one of the potentials of the first logic output terminal and the second logic output terminal at the time of the idle phase, and a second setting means for setting the potential of the control node to a potential that at least can cut off the two terminals to which the first and second switching means are connected according to the potential of the first logic output terminal or the second logic output terminal at the time of the working phase, and a two rail type logic tree having two rails connected to the first logic input terminal and the second logic input terminal of the differential sense amplifier circuit, in which only one rail forms a route reaching the reference potential according to an input signal.

According to the present invention, when a control signal indicating the idle phase is supplied, the first logic output terminal and the second logic output terminal of the sense amplifier circuit are initialized to the reference potential, for example, 0V (second level).

By this, the setting to a second power supply potential by the second setting means of the connection setting means is suppressed, and the control node is set substantially at the first power supply potential by the first setting means. As a result, the first logic input terminal and the first logic output terminal are electrically connected by the first switching means, and the second logic input terminal and the second logic output terminal are electrically connected by the second switching means.

Here, when the phase switches to the working phase, the setting to the first power supply potential by the first setting means of the connection setting means is suppressed, and the control node is set at a second power supply potential by the second setting means.

Then, in the sense amplifier, according to the difference of the conduction resistances possessed by the first and second logic inputs, the potentials of the first logic output and the second logic output are defined as (first level, second level) or (second level, first level).

BRIEF DESCRIPTION OF THE DRAWINGS

These and other objects and features of the present invention will become clearer from the following description of the preferred embodiments given with reference to the accompanying drawings, in which:

FIGS. 6A and 6B are an explanatory views for a leakage current of a CMOS inverter, in which FIG. 6A is a circuit diagram of a simulation target, and FIG. 6B is a view of an output voltage and leakage current versus input voltage characteristics as the simulation results;

FIG. 14 is a view of the lowest power supply voltage at which a normal operation is achieved even in a case where a coupling noise is given;

DESCRIPTION OF THE PREFERRED EMBODIMENTS

Below, preferred embodiments will be described with reference to the accompanying drawings.

First Embodiment

Figure 9:
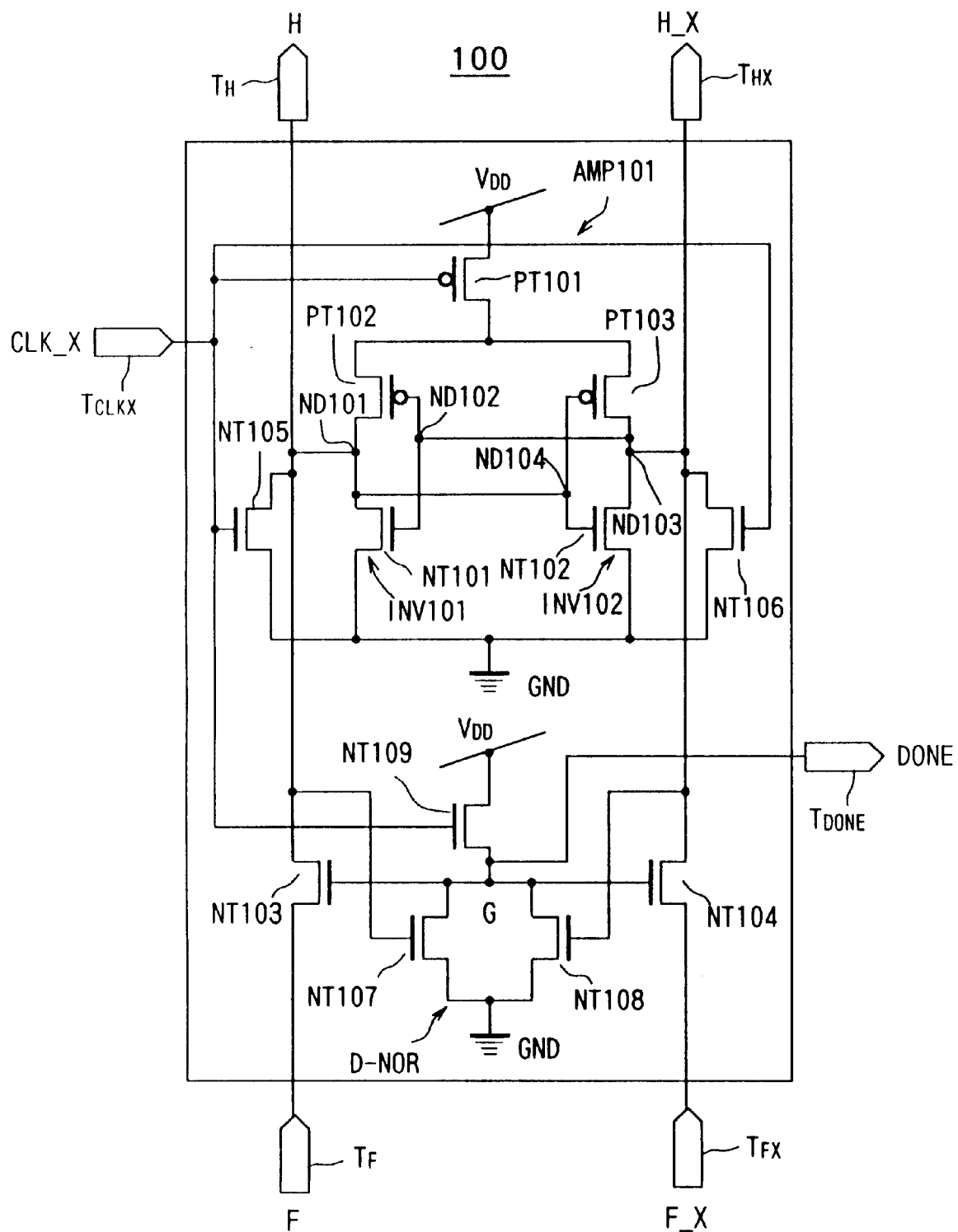
FIG. 9 is a circuit diagram of a first embodiment of a differential sense amplifier circuit according to the present invention.

FIG. 9 is a circuit diagram of a first embodiment of a differential sense amplifier circuit according to the present invention.

This differential sense amplifier circuit 100 has, as shown in FIG. 9, PMOS transistors PT101 to PT103, NMOS transistors NT101 to NT109, a first logic input terminal TF, a second logic input terminal TFX, a first logic output terminal TH, a second logic output terminal THX, a clock input terminal TCLKX, and a completion signal use output terminal TDONE indicating the definition of the logic.

The source of the PMOS transistor PT101 is connected to the supply line of the power supply voltage $V_{DD}$, while its drain is connected to the sources of the PMOS transistors PT102 and PT103.

The drains and the gates of the PMOS transistor PT102 and the NMOS transistor NT101 are connected to each other to configure an inverter INV101.

An output node ND101 of the inverter INV101 is configured by the connection point of the drains of the PMOS transistor PT102 and the NMOS transistor NT101, while an input node ND102 of the inverter INV101 is configured by the connection point of their gates.

Similarly, the drains and the gates of the PMOS transistor PT103 and the NMOS transistor NT102 are connected to each other to configure an inverter INV102.

An output node ND103 of the inverter INV102 is configured by the connection point of the drains of thes PMOS transistor PT103 and the NMOS transistor NT102, while an input node ND104 of the inverter INV102 is configured by the connection point of their gates.

The sources of the NMOS transistors NT101 and NT102 are grounded.

The output node ND101 of the inverter INV101 is connected to the input node ND104 of the inverter INV102 and the logic output terminal TH, while the output node ND103 of the inverter INV102 is connected to the input node ND102 of the inverter INV101 and the logic output terminal HX.

A sense amplifier AMP101 is configured by the PMOS transistors PT101 to PT103 and NT101 and NT102 having the above connection relationship.

The NMOS transistor NT103 serving as the first switching means is connected between the logic output terminal TH and the logic input terminal TF, while the NMOS transistor NT104 serving as the second switching means is connected between the logic output terminal THX and the logic input terminal TFX.

Further, the NMOS transistor NT105 serving as the first switch element of the initializing means is connected between the logic output terminal TH and the ground, while the NMOS transistor NT106 serving as the second switch element is connected between the logic output terminal THX and the ground.

These NMOS transistors NT105 and NT106 are utilized for lowering the logic outputs H and H_X to 0V at the time of the idle phase (CLK_X=1), that is, for initializing them to the reference potential.

Further, the sources of the NMOS transistors NT107 and NT108 are grounded, while the drains of them are commonly connected to the gates of the NMOS transistors NT103 and NT104, the drain of the NMOS transistor NT109, and the completion signal use output terminal TDONE. Further, the source of the NMOS transistor NT109 is connected to the supply line of the power supply voltage $V_{DD}$.

Then, the gate of the PMOS transistor PT101 and the gates of the NMOS transistors NT105, NT106, and NT109 are connected to the clock input terminals TCLKX.

The gate of the NMOS transistor NT107 is connected to the connection point of the logic input terminal TH and the NMOS transistor NT103, while the gate of the NMOS transistor NT108 is connected to the connection point of the logic input terminal THX and the NMOS transistor NT104.

A dynamic NOR circuit is configured by the NMOS transistors NT107 to NT109 having the above connection relationship and acts as a connection controlling means for cutting off the logic tree.

Next, an explanation will be made of the operation by the above configuration.

First, in the idle phase, when the clock signal CLK has a logic "0", that is, the clock inverted signal CLK_X has a logic "1", it is supplied via the clock input terminal TCLKX to the gate of the PMOS transistor PT101 and the gates of the NMOS transistors NT105, NT106, and NT109.

By this, the PMOS transistor PT101 is held in an OFF state, and the sense amplifier AMP101 is in a non-operating state.

On the other hand, the NMOS transistors NT105 and NT106 become ON, and the potentials of the logic output terminals TH and THX are completely reduced to 0V.

As a result, the NMOS transistors NT107 and NT108 with the gates to which the logic output terminals TH and THX are connected are cut off.

At this time, the NMOS transistor NT109 receiving the clock inverted signal CLK_X of the logic "1" becomes ON. As a result, a control node G connected to the gates of the NMOS transistors NT103 and NT104 for cutting off the logic tree is precharged up to substantially the power supply voltage $V_{DD}$ level. In actuality, it is precharged up to $V_{DD}$-Vth (Vth is the threshold value of the NMOS transistor). This precharge potential is a potential that can turn on the NMOS transistors NT103 and NT104 to a sufficient degree for passing the current through them.

By this, the NMOS transistors NT103 and NT104 beacome ON to such an extent that they pass the current therethrough, and the sense amplifier AMP101 and the not illustrated logic tree connected to the logic input terminals TF and TFX are electrically connected.

Namely, in the idle phase, the sense amplifier AMP101 and the logic tree are electrically connected.

The phase becomes the working phase in this state and the clock signal CLK is supplied at the logic "1", that is, the clock inverted signal CLK_X is supplied at the logic "0", via the clock input terminal TCLKX to the gate of the PMOS transistor PT101 and the gates of the NMOS transistors NT105, NT106, and NT109.

By this, the PMOS transistor PT101 turns ON, the NMOS transistors NT105 and NT106 become cut off, and the sense amplifier AMP101 operates.

At this time, the NMOS transistors NT103 and NT104 have become ON from the idle phase, so the currents immediately start to flow toward the logic input terminals TF and TFX and the logic evaluation is started.

The difference of the currents is increased as the potential difference by the sense amplifier AMP101, whereby the logic is finally defined.

In the middle of this, when the logic output H is approaching the logic "1", the NMOS transistor NT107 of the dynamic NOR circuit D-NOR with the gate connected to the logic output terminal TH becomes ON.

Alternatively, when the logic output H_X is approaching the logic "1", the NMOS transistor NT108 of the dynamic NOR circuit D-NOR with the gate of connected to the logic output terminal THX becomes ON.

In any case, the charge existing at the control node G is discharged, and the potential thereof becomes 0V.

Along with this, the NMOS transistors NT103 and NT104 become cut off, and the sense amplifier and the logic tree are electrically cut off.

By this action, the current flowing from the sense amplifier AMP101 into the logic tree is suppressed to the required lowest limit.

Figure 10:
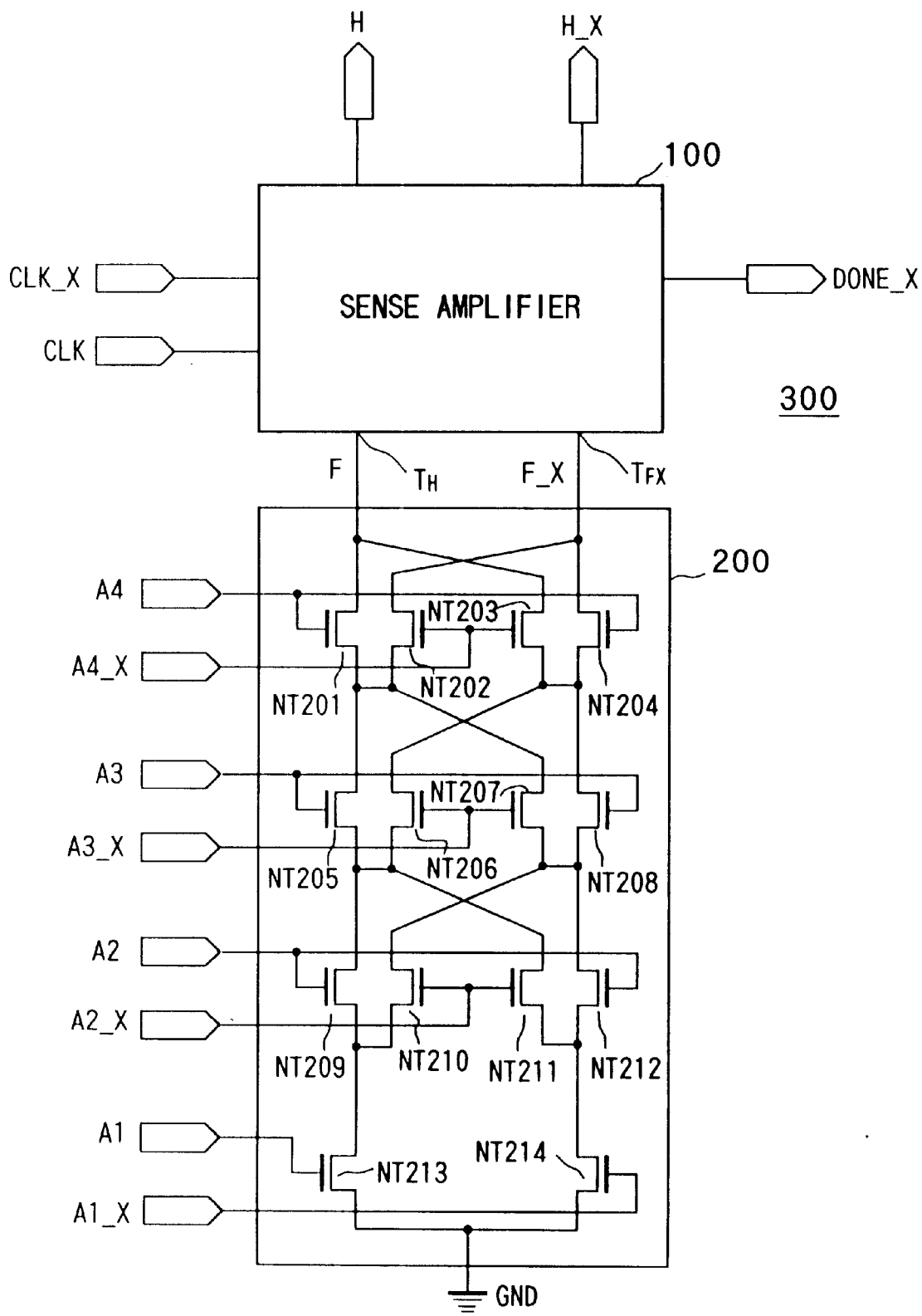
FIG. 10 is a view of an example of a dynamic logic circuit configured by combining the differential sense amplifier circuit according to the present invention and an NMOS duality logic tree (two rail type logic tree)

Further, as shown in FIG. 10, by combining the differential sense amplifier circuit 100 as mentioned above and an NMOS duality logic tree (two rail type logic tree) 200, a dynamic logic circuit 300 according to the logic function realized by that logic tree can be realized.

In the example of FIG. 10, the NMOS duality logic tree (two rail type logic tree) 200 is configured by a 4-input EXOR comprising NMOS transistors NT201 to NT214, whereby a dynamic logic circuit 300 is realized.

In the NMOS duality logic tree 200, the NMOS transistors NT201, NT205, NT209, and NT213 are connected in series between the logic input terminal TF of the sense amplifier circuit 100 and the ground.

Further, the NMOS transistors NT204, NT208, NT212, and NT214 are connected in series between the logic input terminal TFX of the sense amplifier circuit 100 and the ground.

The NMOS transistor NT202 is connected between the logic input terminal TFX and the connection point of the NMOS transistors NT201 and NT205, while the NMOS transistor NT203 is connected between the logic input terminal TF and the connection point of the NMOS transistors NT204 and NT208.

Then, a signal A4 is supplied to the gates of the NMOS transistors NT201 and NT204, while an inverted signal A4_X of the signal A4 is supplied to the gates of the NMOS transistors NT202 and NT203.

The NMOS transistor NT206 is connected between the connection point of the NMOS transistors NT203 and NT204 and the connection point of the NMOS transistors NT205 and NT209, while the NMOS transistor NT207 is connected between the connection point of the NMOS transistors NT201 and NT202 and the connection point of the NMOS transistors NT208 and NT212.

Then, a signal A3 is supplied to the gates of the NMOS transistors NT205 and NT208, while an inverted signal A3_X of the signal A3 is supplied to the gates of the NMOS transistors NT206 and NT207.

Further, the NMOS transistor NT210 is connected between the connection point of the NMOS transistors NT207 and NT208 and the connection point of the NMOS transistors NT209 and NT213, while the NMOS transistor NT211 is connected between the connection point of the NMOS transistors NT205 and NT206 and the connection poiint of the NMOS transistors NT212 and NT214.

Then, a signal A2 is supplied to the gates of the NMOS transistors NT209 and NT212, while an inverted signal A2_X of the signal A2 is supplied to the gates of the NMOS transistors NT210 and NT211.

Further, a signal A1 is supplied to the gate of the NMOS transistor NT213, while an inverted signal A1_X cf the signal A1 is supplied to the gate of the NMOS transistor NT214.

In the two rail type logic tree 200, one of the rails of the logic input F or the logic input F_X to the sense amplifier circuit 100 will always have a route reaching the ground, while the other will be cut off in the middle of the route.

The sense amplifier circuit 100 of FIG. 9 was used to configure the 4-input EXOR dynamic logic circuit 300 as shown in FIG. 10 for simulation. Further, the resistance to noise was similarly evaluated.

Figure 11:
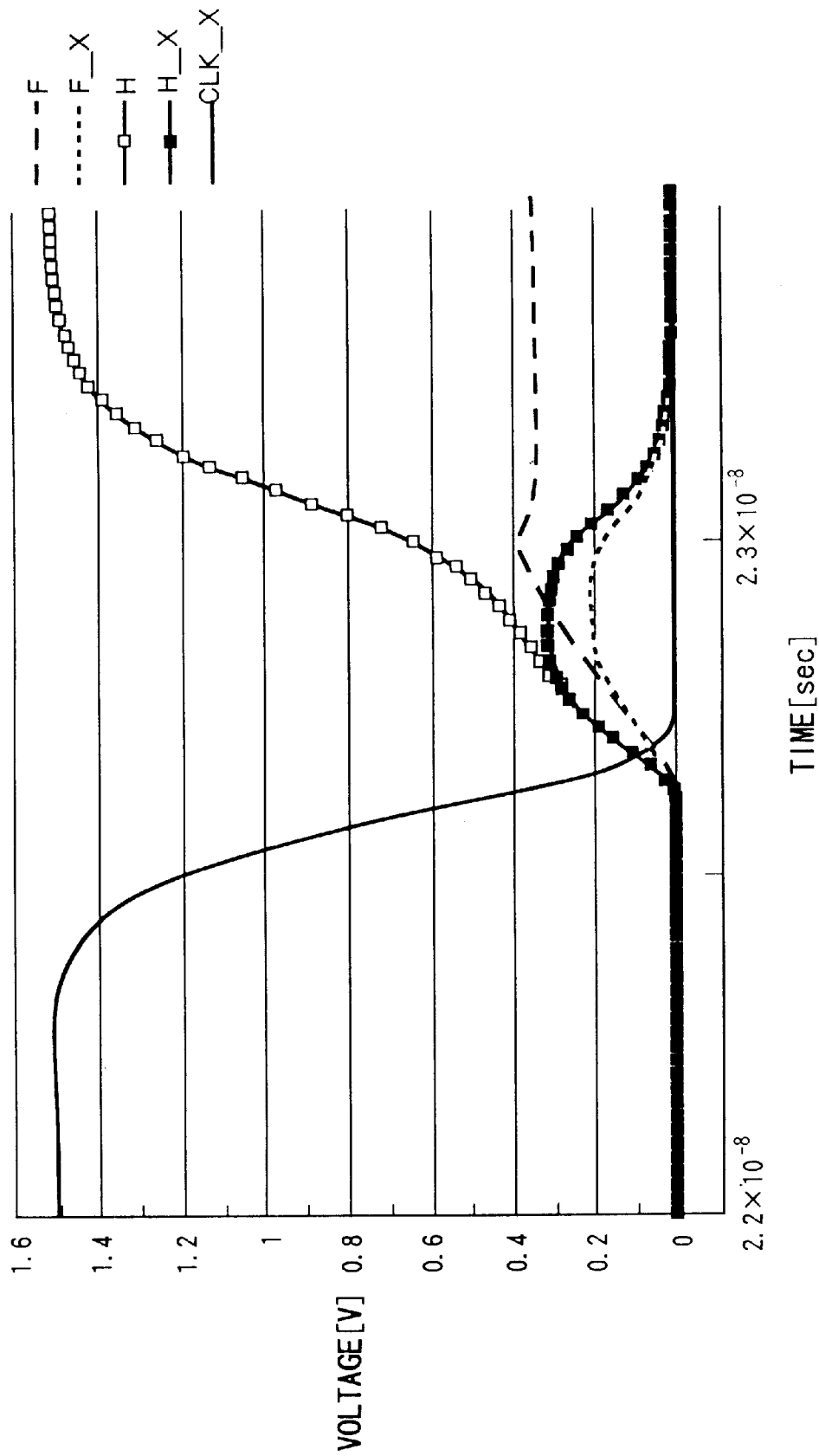
FIG. 11 is a view of a waveform when the sense amplifier circuit of FIG. 9 where no noise is given switches to a working phase.
Figure 12:
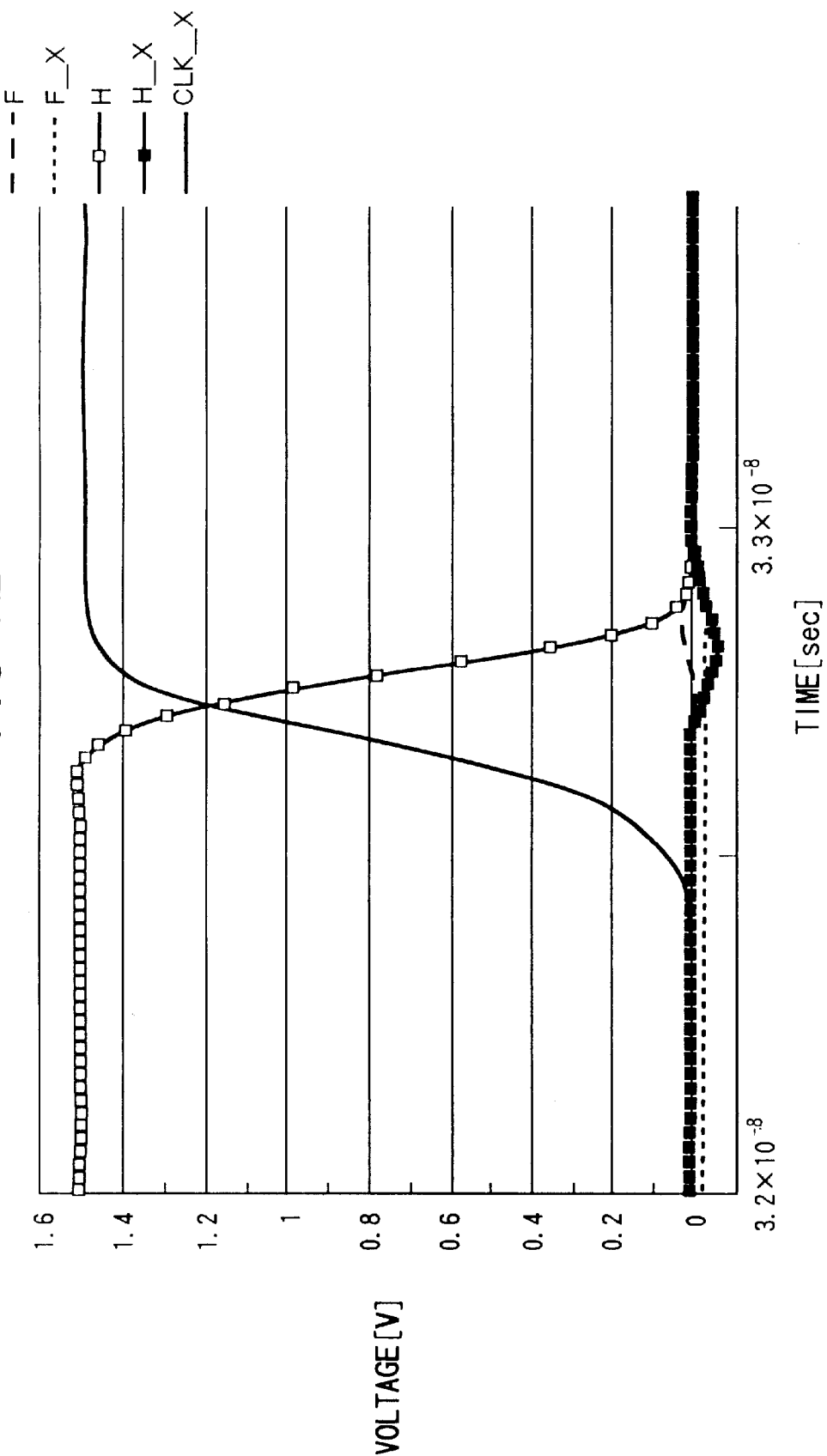
FIG. 12 is a view of a waveform when the sense amplifier circuit of FIG. 9 where no noise is given switches to an idle phase.
Figure 13:
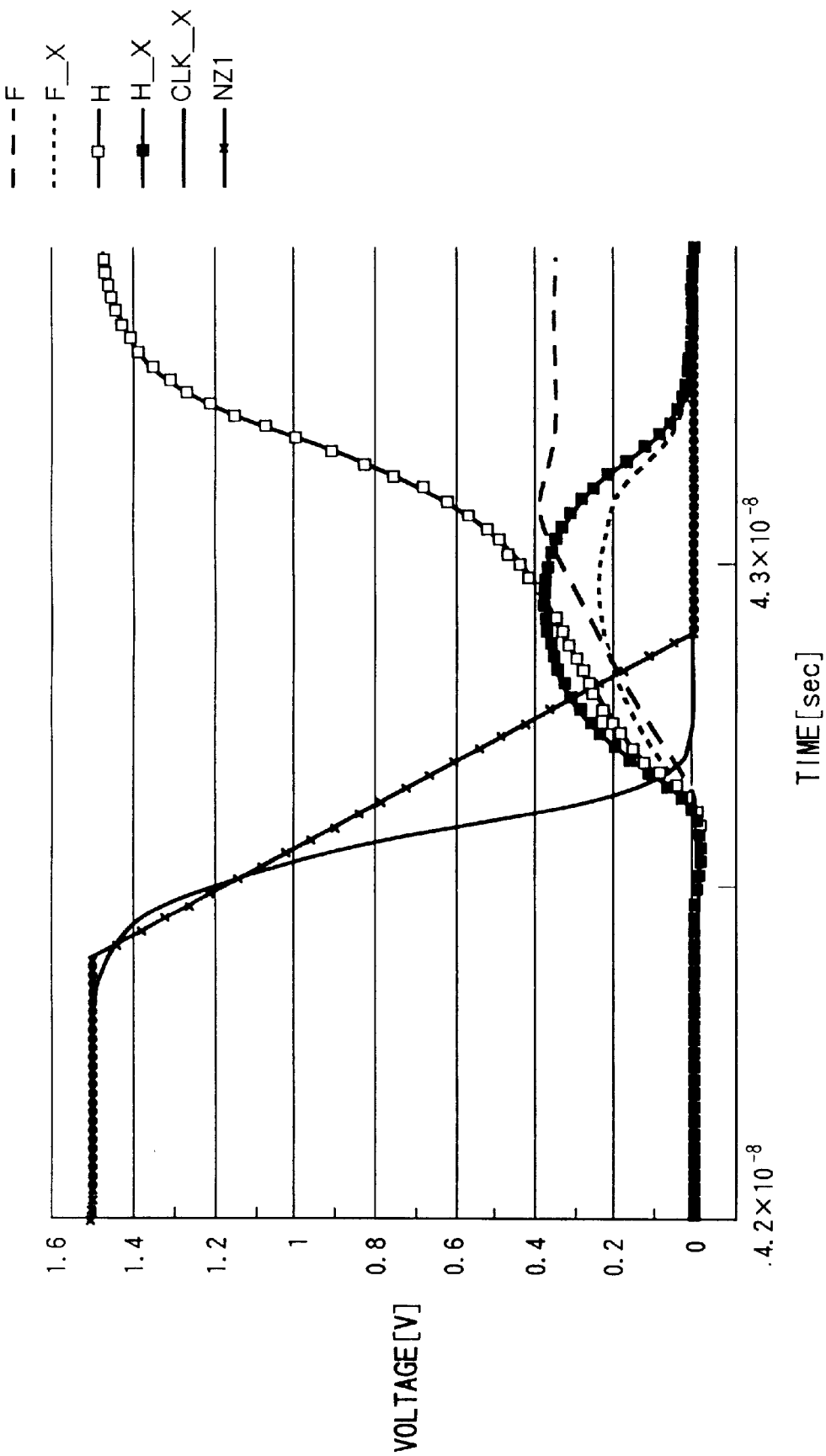
FIG. 13 is a view of the waveform when the sense amplifier circuit of FIG. 9 where noise is given switches to a working phase.

FIG. 11 is a view of the waveform when the sense amplifier circuit 100 of FIG. 9 where no noise is given switches to the working phase, FIG. 12 is a view of the waveform when the sense amplifier circuit 100 of FIG. 9 where no noise is given switches to the idle phase, and FIG. 13 is a view of the waveform when the sense amplifier circuit 100 of FIG. 9 switches to the working phase where noise is given.

In FIG. 11, FIG. 12, and FIG. 13, the abscissa indicates the time, while the ordinate indicates the voltage.

First, although not shown in the figure, the differential sense amplifier circuit 100 of FIG. 9 amplifies the completion signal DONE indicating that the logic was defined from 0V to the substantial power supply voltage level.

Accordingly, the first problem of the prior art was solved by the differential sense amplifier circuit 100 of FIG. 9.

As apparent when viewing FIG. 11, in the idle phase before switching to the working phase, the logic outputs H and H_X have become the ideal 0V.

Further, as shown in FIG. 12, in the differential sense amplifier cirouit 100 of FIG. 9, when the phase switches to the idle phase, the voltage is smoothly lowered down to 0V.

Accordingly, according to the differential sense amplifier circuit 100 of FIG. 9, the logic outputs H and H_X do not become 0V in the idle phase, but rise by the amount of the NMOS threshold value voltage, therefore the second problem of the prior art that the leakage current becomes large is solved.

Further, as apparent when viewing FIG. 13, in the present invention, no malfunction is observed.

Figure 1:
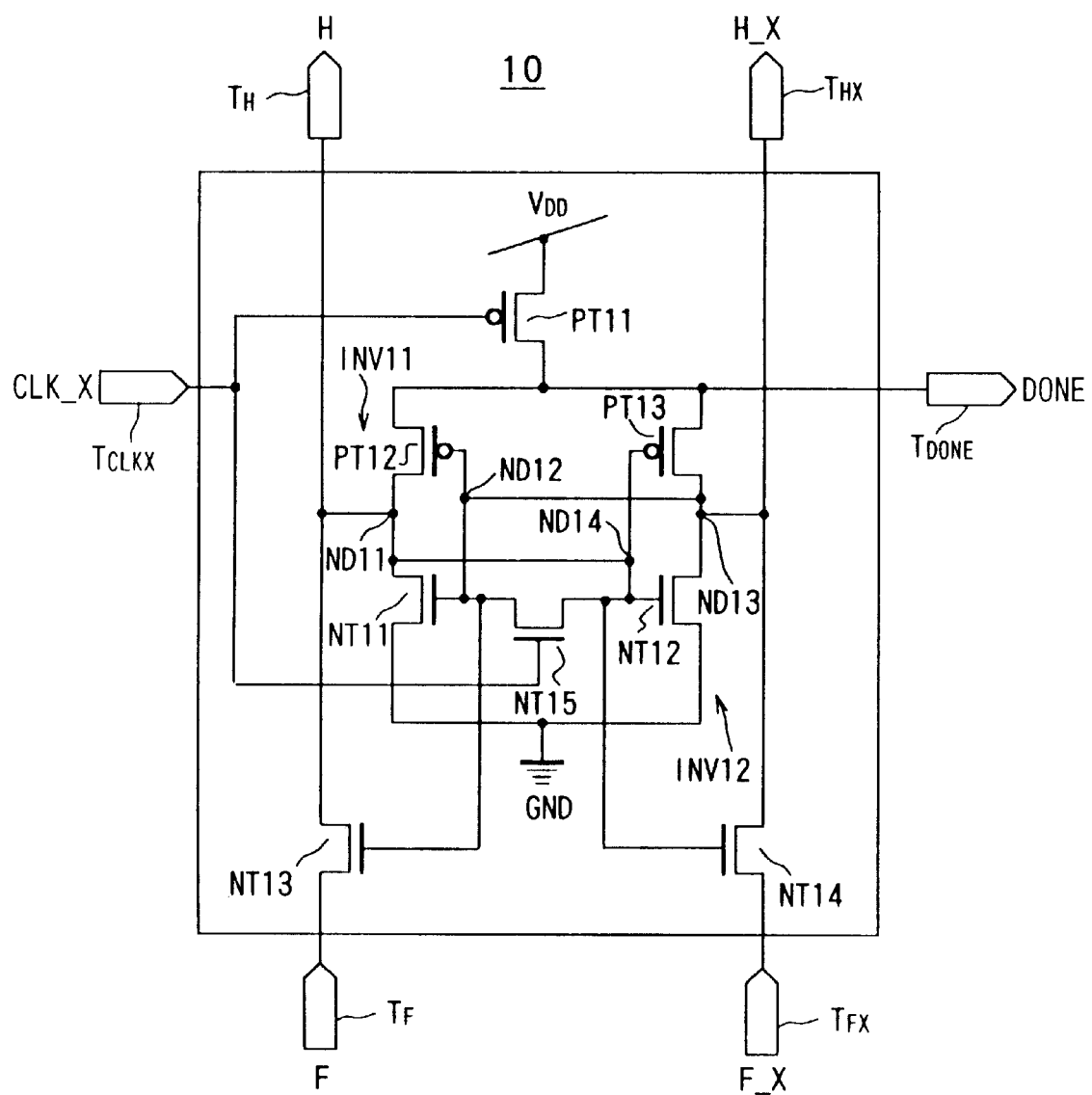
FIG. 1 is a circuit diagram of an example of the configuration of a differential sense amplifier circuit of the prior art.
Figure 2:
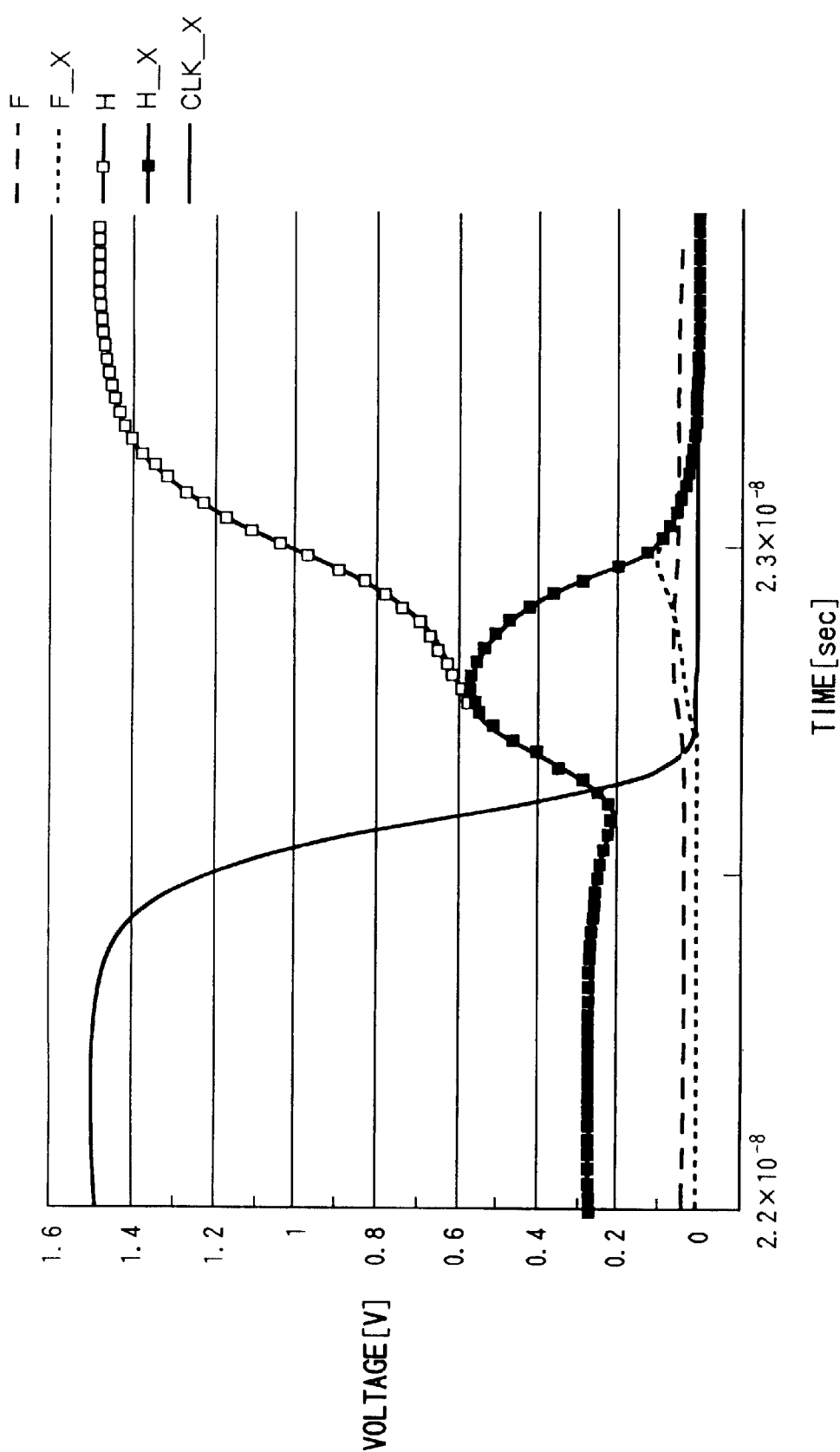
FIG. 2 is a view of an operation waveform (simulation result) at a rising edge of a clock CLK of the sense amplifier of DCSL3 type, that is, a trailing edge of a clock inverted signal CLK_X.
Figure 3:
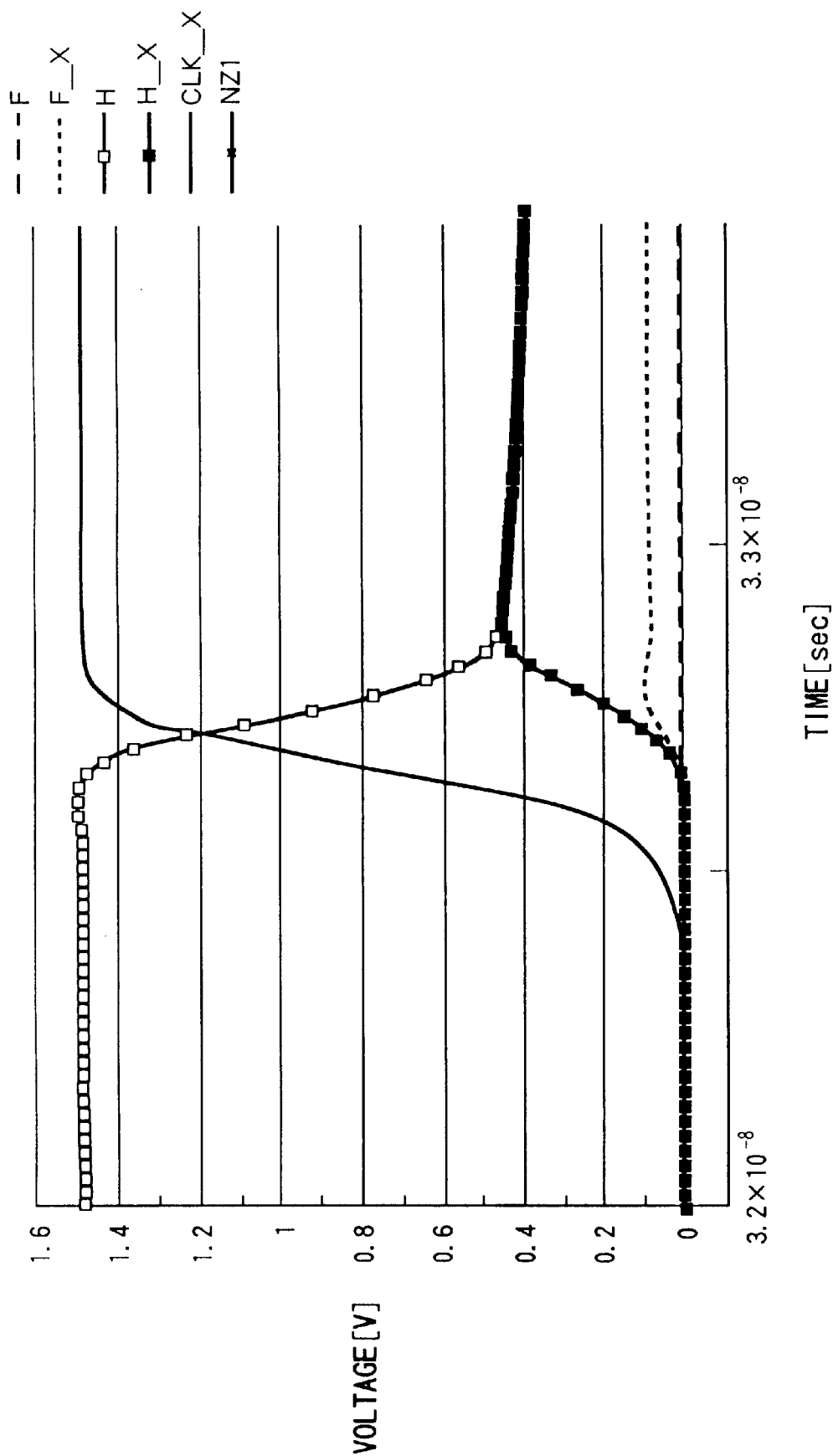
FIG. 3 is a view of the operation waveform (simulation result) at a trailing edge of the clock CLK of the sense amplifier of DCSL3 type, that is, a rising edge of the clock inverted signal CLK_X.
Figure 4:
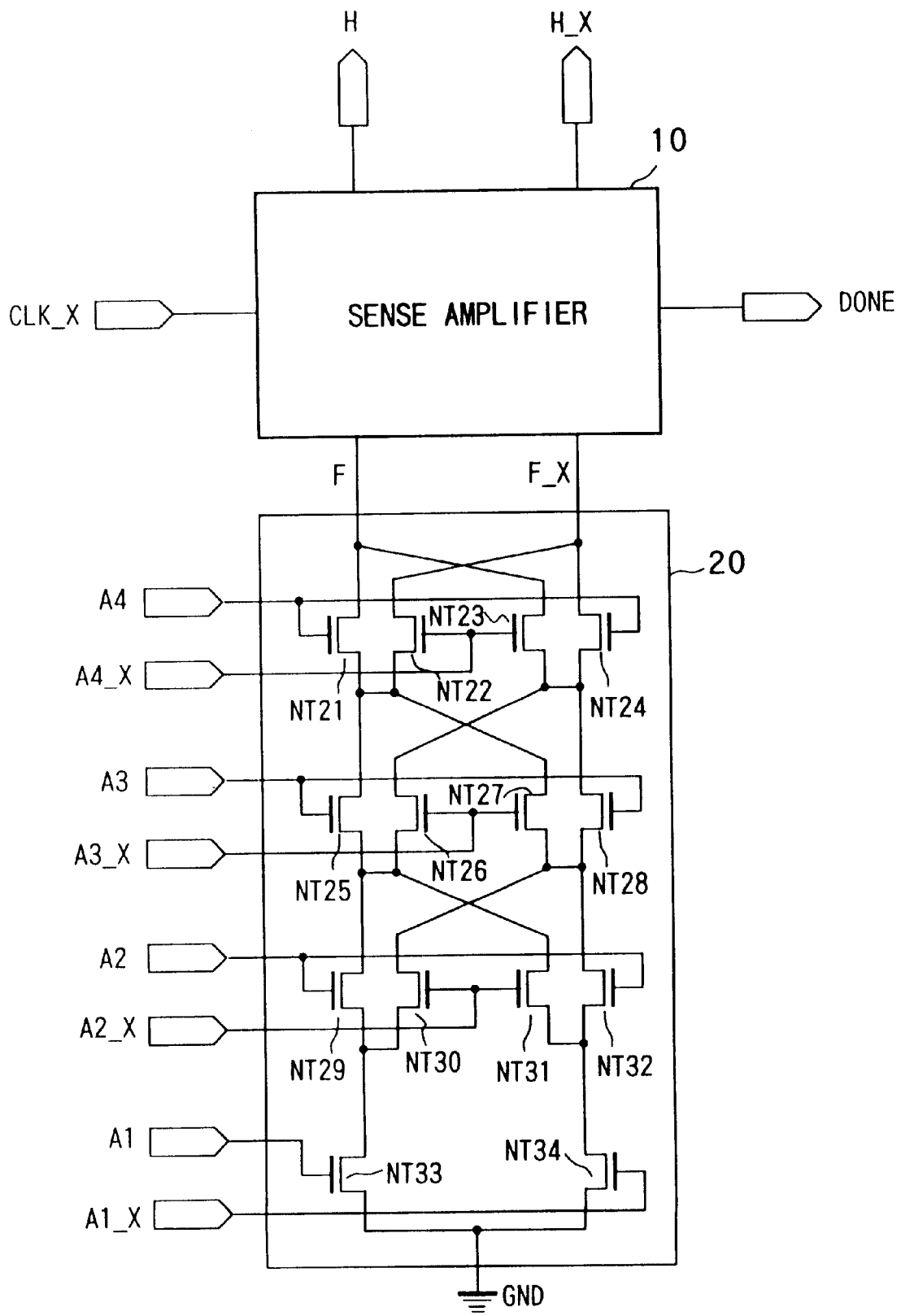
FIG. 4 is a view of the configuration showing a dynamic logic circuit configured by connecting a duality logic tree configured by NMOS transistors to logic input terminals TF and TFX of the differential sense amplifier circuit of the DCSL3 type.
Figure 5:
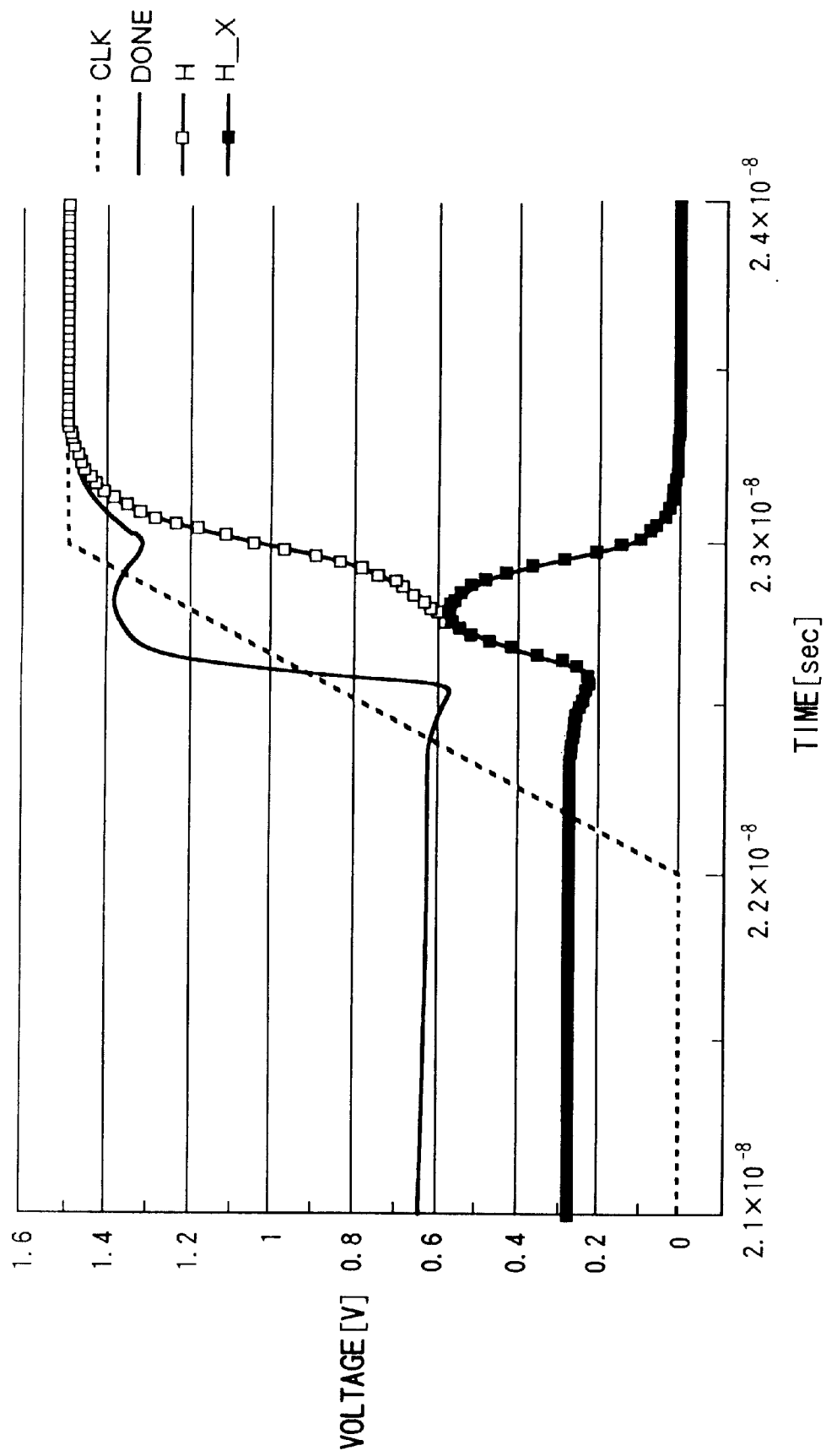
FIG. 5 is a view of a situation of a completion signal DONE when the phase switches from the idle phase to the working phase in the sense amplifier circuit of the DCSL3 type.
Figure 7:
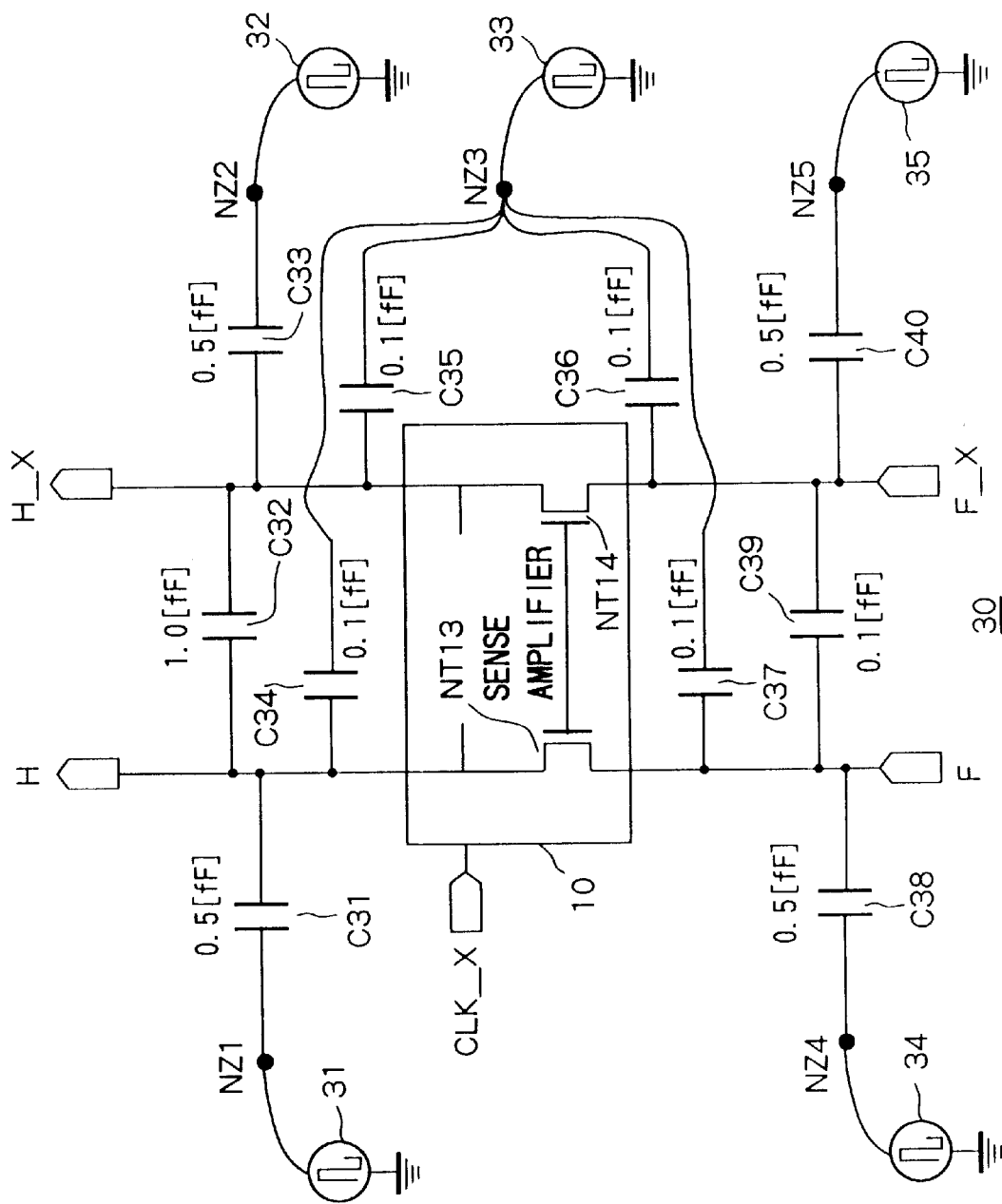
FIG. 7 is a view of a model for evaluation of resistance to coupling noise.
Figure 8:
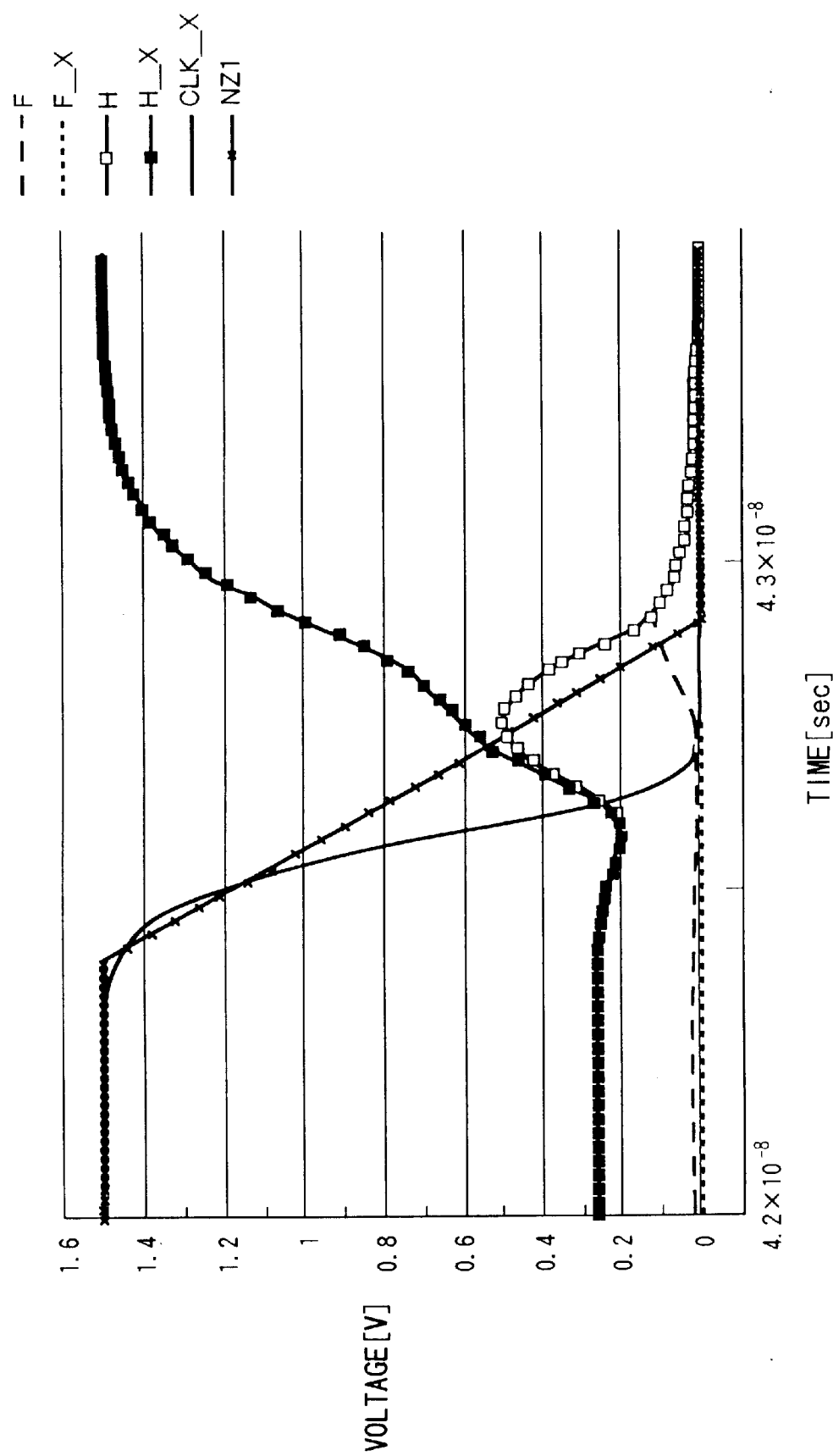
FIG. 8 is a view of the operation waveform of a case where the model for evaluation of resistance to coupling noise of FIG. 7 is applied to the sense amplifier of the DCSL3 type, and a falling signal is given to a node NZ1 at almost the same timing as the trailing edge of the clock inverted signal CLK_X.

There is a period during which the potential of tbe logic output H becomes lower than the logic output H_X under the influence of the falling of the noise NZ1 in the evaluation use model 30 of FIG. 7.

In the sense amplifier circuit of the DCSL3 type, the voltage difference ends up being increased as it is.

In the sense amplifier circuit of FIG. 9, however, as shown in FIG. 13, a situation where the potential difference of the noise is reversed and the potentials of the logic outputs H and H_X converge toward the correct logic value is exhibited.

This phenomenon is realized by the action of the control mechanism of the cutoff of the logic tree by the dynamic NOR circuit D-NOR configured by the NMOS transistors NT107 to NT109 possessed by the sense amplifier circuit 100.

Accordingly, according to the differential sense amplifier circuit 100 of FIG. 9, the third problem of the prior art that the sense amplifier ends up defining an erroneous value due to the coupling noise is solved.

The malfunction due to the coupling noise depends upon the height of the logic tree and the power supply voltage.

In general, the lower the power supply voltage and the higher the logic tree, the easier the malfunctions due to the coupling noise.

FIG. 14 is a view of the lowest power supply voltage at which the normal operation is achieved even in the case where the coupling noise is given. Note that, in FIG. 14, the sense amplifier circuit 100 of FIG. 9 is indicated as the N2 type.

The height of the logic tree of EXOR is equal to its input order.

As apparent from FIG. 14, in the sense amplifier circuit of the DCSL3 type of the prior art, a malfunction occurs even if the power supply voltage is high and the logic tree is low.

On the other hand, in the EXOR logic using the N2 type sense amplifier circuit 100 according to the present invention, operation is possible even at a voltage lower than 1.5V though depending also upon the conditions.

Accordingly, if the dynamic logic circuit is configured by using the sense amplifier circuit 100 of FIG. 9, a dynamic logic circuit operating stably at a low power supply voltage can be realized.

In general, the power consumption of a CMOS logic circuit is proportional to a square of the power supply voltage. For example, if the power supply voltage is made ½, the power consumption becomes ¼.

Namely, the sense amplifier circuit 100 of FIG. 9 contributes to a great reduction of the power consumption of the CMOS semiconductor integrated circuit.

As explained above, according to the first embodiment, since provision was made of NMOS transistors NT105 and NT106 for initializing the potentials of the logic output terminals TH and THX of the sense amplifier AMP101 to 0V (logic "0") in the idle phase, the NMOS transistors NT103 and NT104 for operationally connecting the logic output terminals TH and THX and the logic input terminals TF and TFX, and a dynamic NOR circuit D-NOR serving as the logic tree cutoff means which makes the NMOS transistors NT103 and NT104 conductive in the idle phase and defines the logic voltages of the logic outputs H and H_X to (0, 1) or (1, 0) according to the difference of the conduction resistances possessed by the logic inputs F and F_X in the working phase, a completion signal not causing a malfunction of a latter logic circuit can be generated and the power consumption when the circuit is stopped can be reduced.

Further, there is no apprehension of occurrence of a malfunction due to coupling noise, so a practical differential sense amplifier and dynamic logic circuit using the same can be realized.

Second Embodiment

Figure 15:
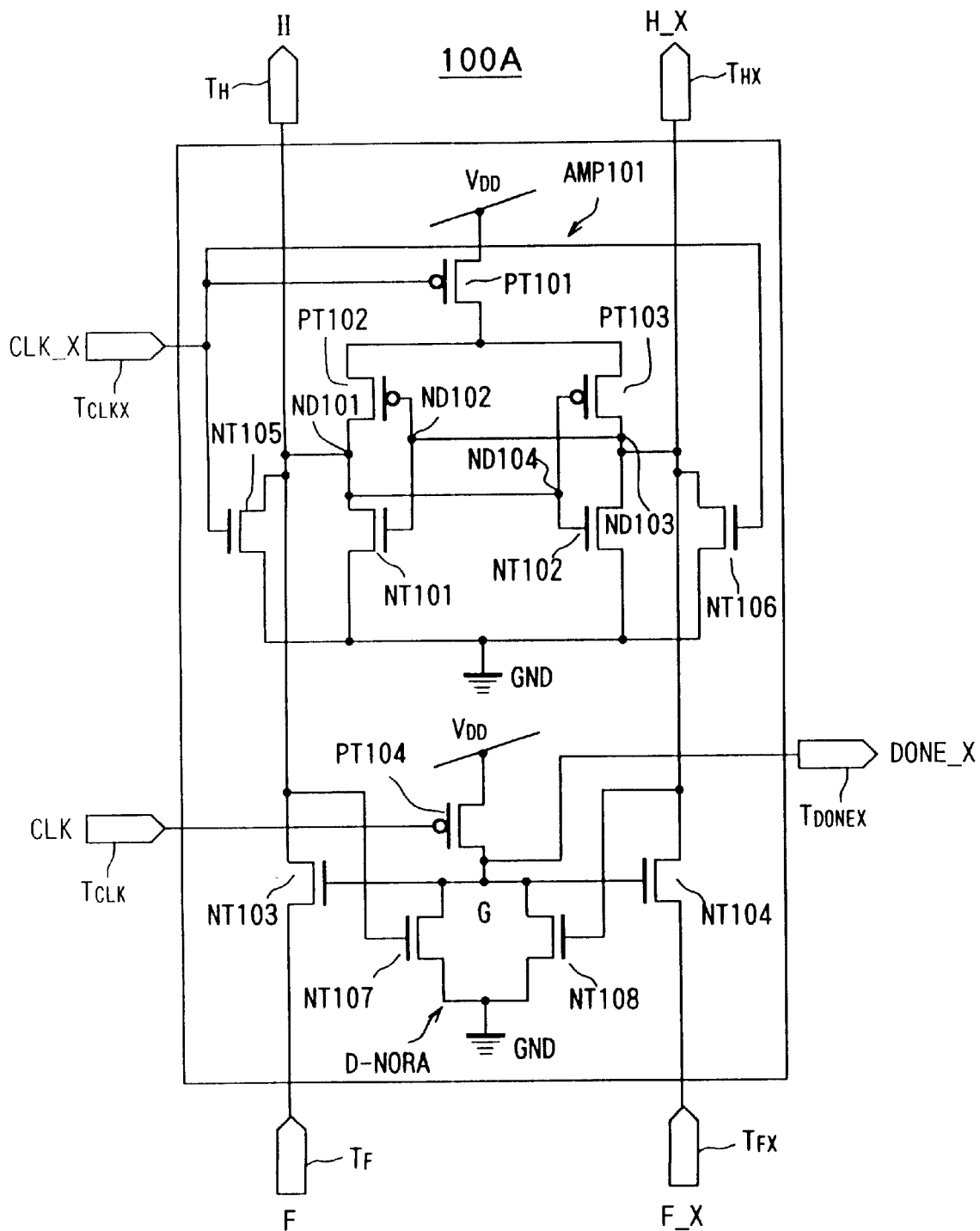
FIG. 15 is a circuit diagram of a second embodiment of the differential sense amplifier circuit according to the present invention.

FIG. 15 is a circuit diagram of a second embodiment of the differential sense amplifier circuit according to the present invention.

The point of difference of the present second embodiment from the first embodiment resides in that the supply line of the power supply voltage $V_{DD}$ Of the dynamic NOR circuit and the control node G are connected by the precharge use PMOS transistor PT104 in place of the precharge use NMOS transistor, while the gate of the PMOS transistor PT104 is connected to the clock input terminal TCLK of the clock signal CLK in place of the clock input terminal TCLKX of the clock inverted signal CLK_X.

The rest of the configuration and functions are similar to those of the first embodiment mentioned above, so a detailed explanation thereof will be omitted.

A sense amplifier circuit 100A of FIG. 15 was used to configure the 4-input EXOR dynamic logic circuit 300 as shown in FIG. 10 for simulation. Further, the resistance to noise was similarly evaluated.

Figure 16:
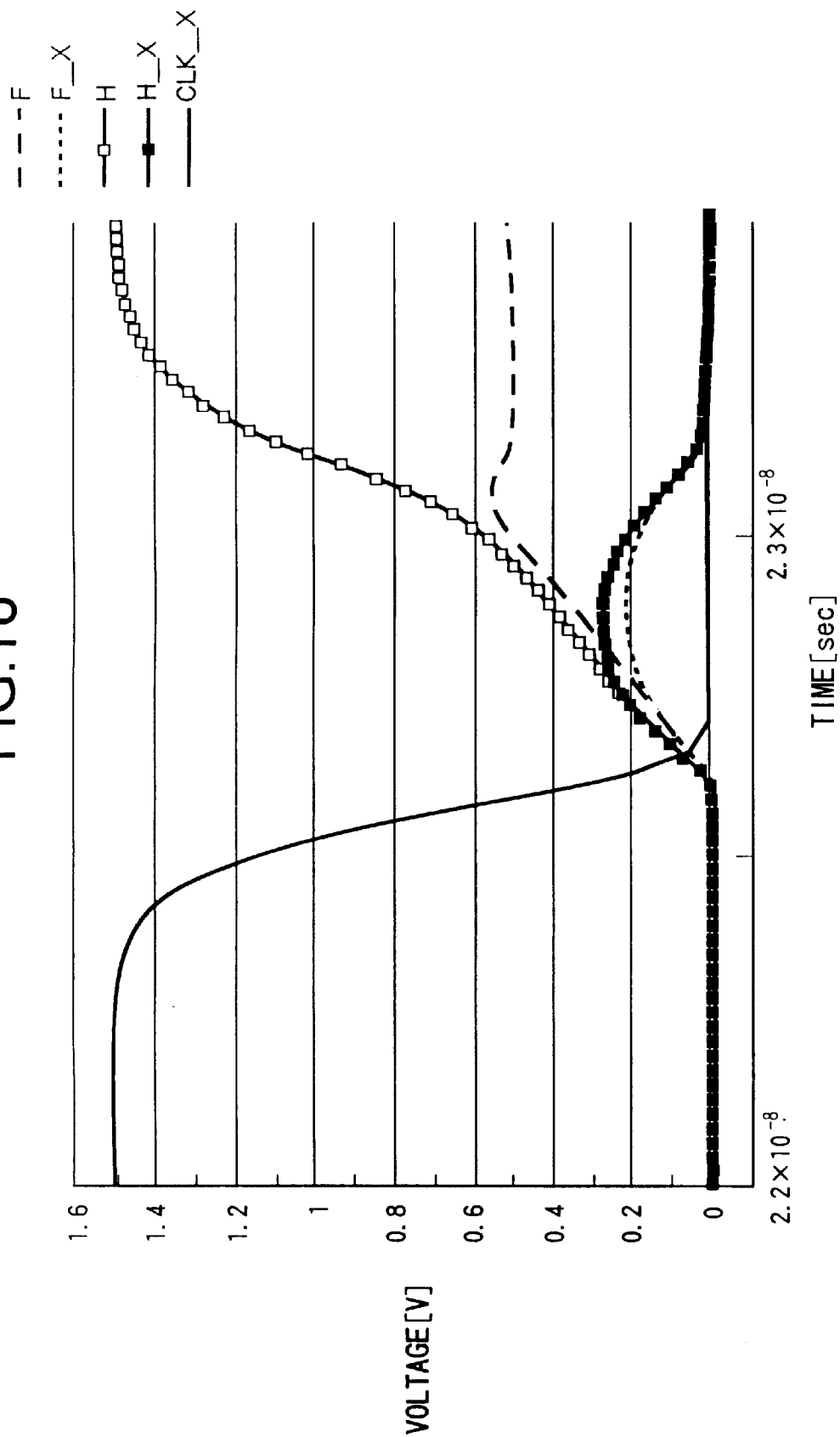
FIG. 16 is a view of the waveform when the sense amplifier circuit of FIG. 15 where no noise is given switches to the working phase.
Figure 17:
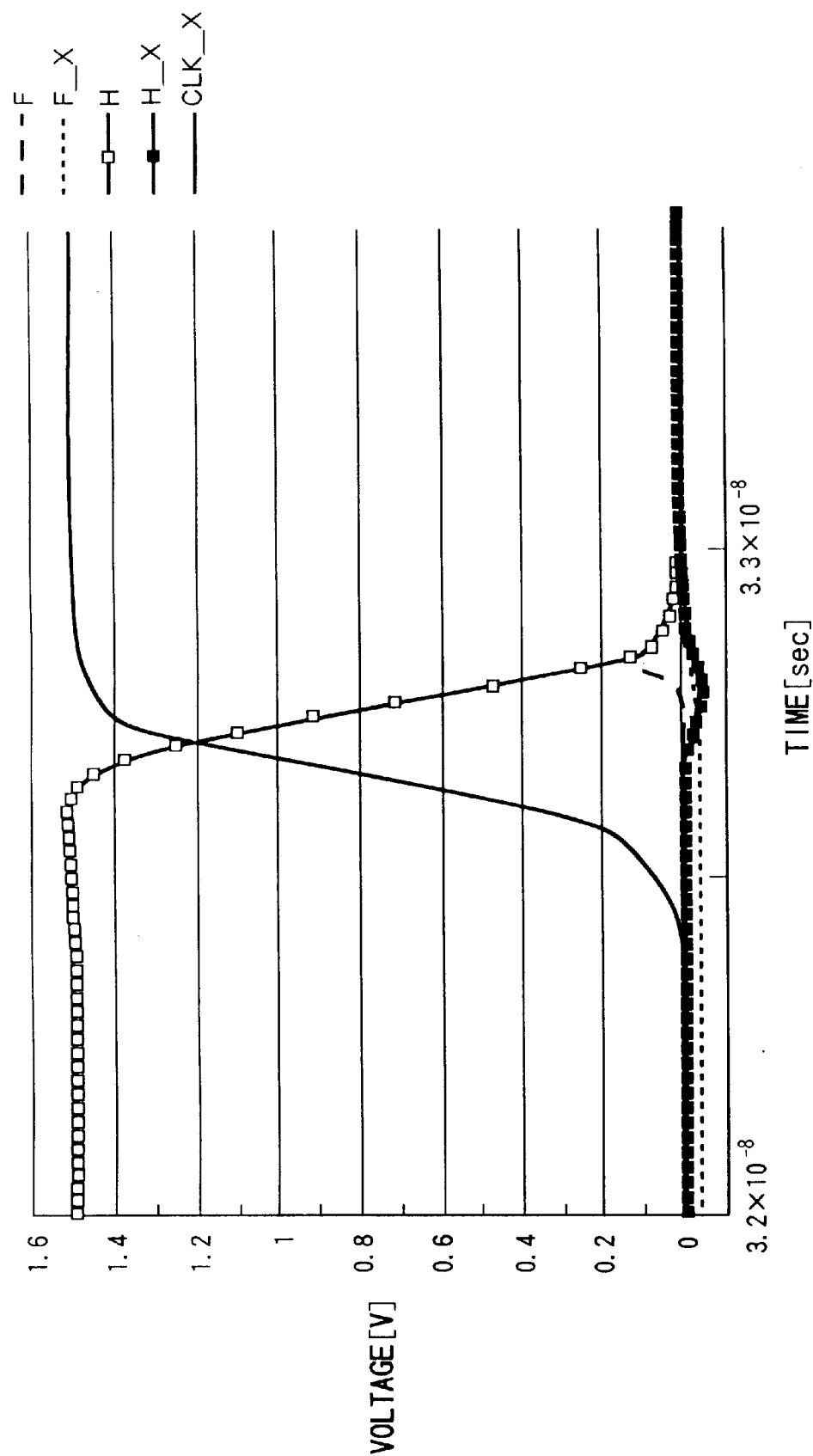
FIG. 17 is a view of the waveform when the sense amplifier circuit of FIG. 15 where no noise is given switches to the idle phase.
Figure 18:
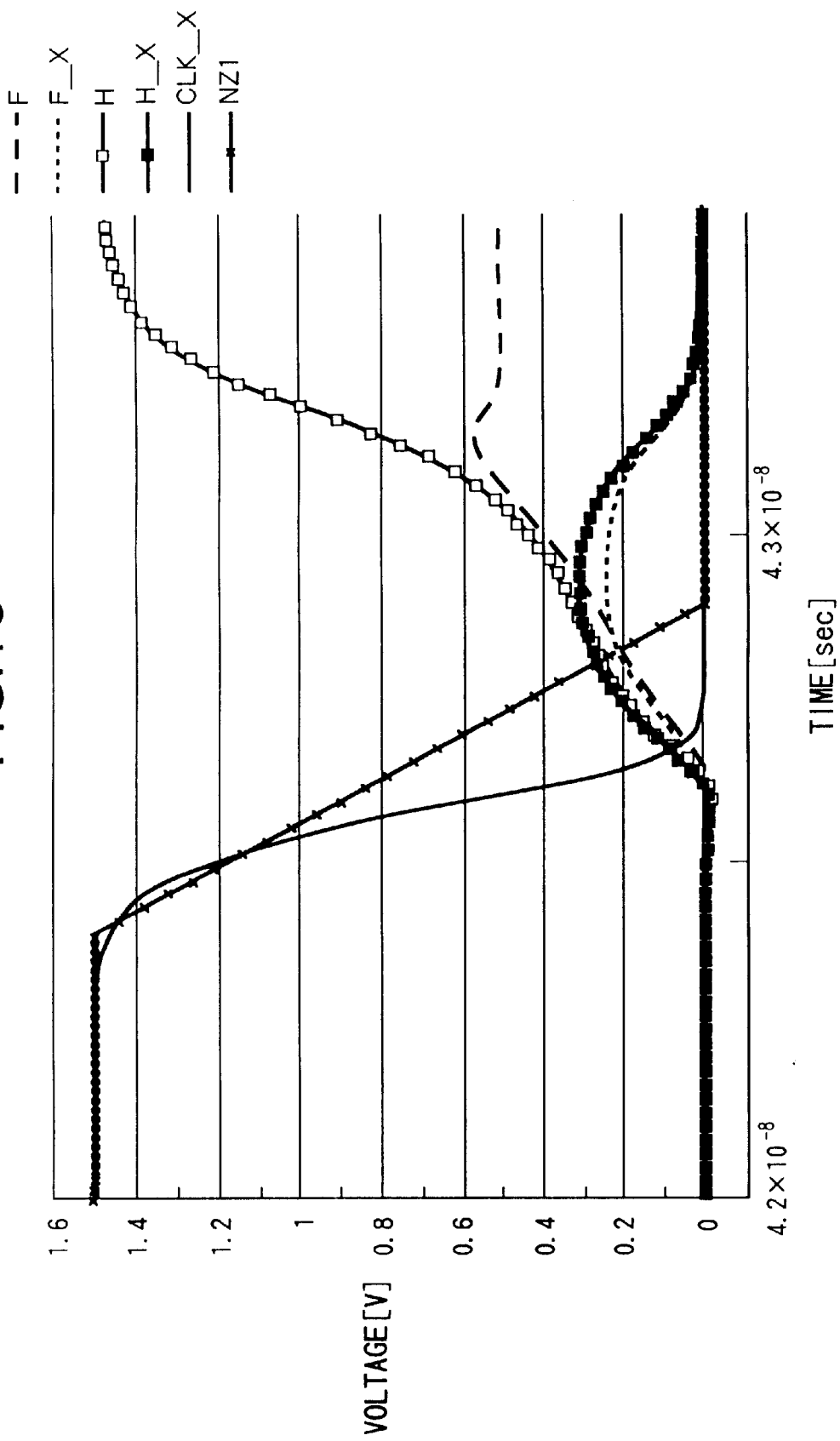
FIG. 18 is a view of the waveform when the sense amplifier circuit of FIG. 15 where noise is given switches to the working phase.

FIG. 16 is a view of the waveform when the sense amplifier circuit 100A of FIG. 15 when no noise is given switches to the working phase, FIG. 17 is a view of the waveform when the sense amplifier circuit 100A of FIG. 15 where no noise is given switches to the idle phase, and FIG. 18 is a view of the waveform when the sense amplifier circuit 100A of FIG. 15 where noise is given switches to the working phase.

Figure 19:
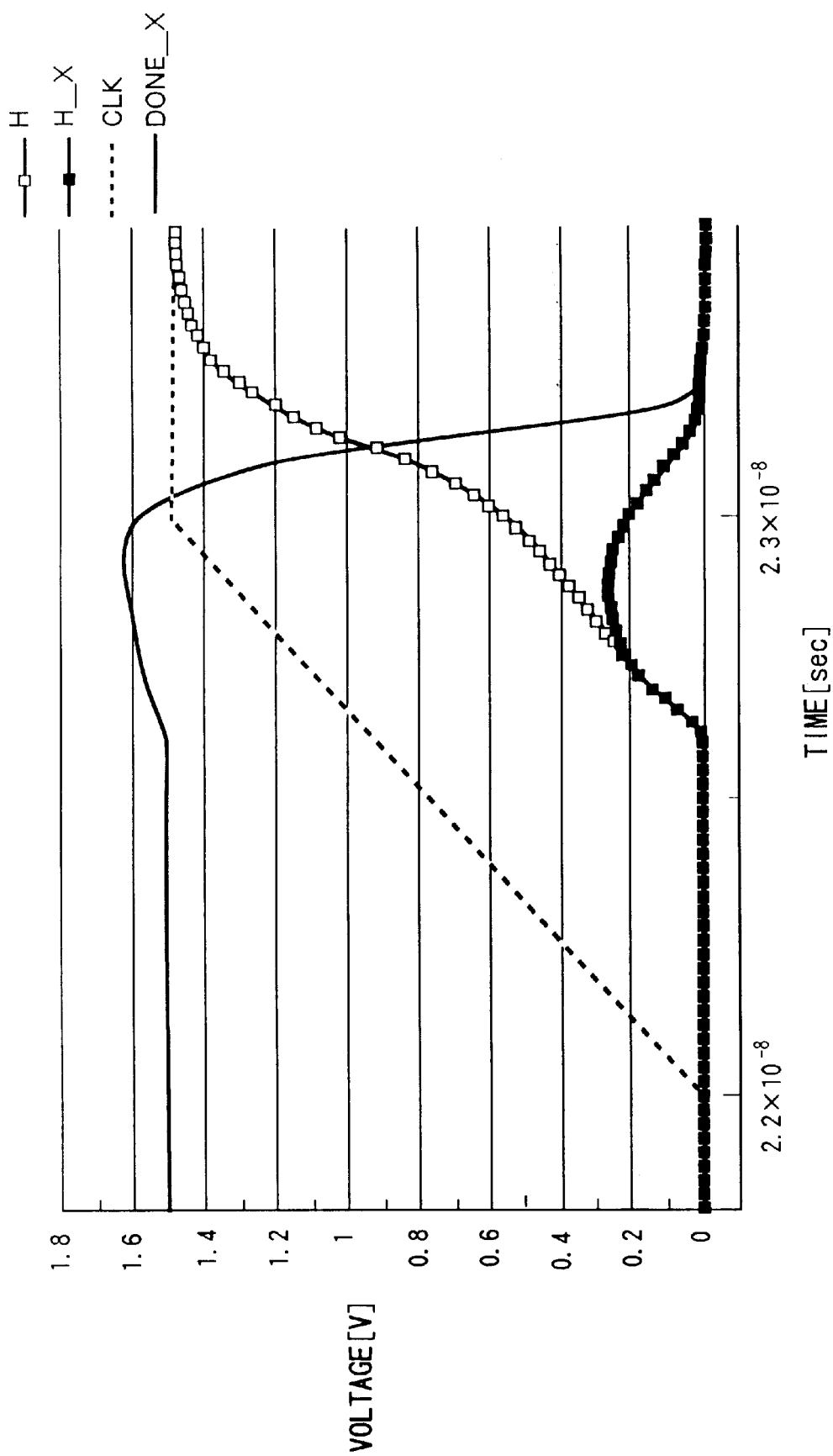
FIG. 19 is a view of the waveform of a completion signal DONE_X in the sense amplifier circuit of FIG. 15.

Further, FIG. 19 is a view of the waveform of the completion signal DONE_X in the sense amplifier circuit 100A of FIG. 15.

In FIG. 16, FIG. 17, FIG. 18, and FIG. 19, the abscissas indicate the time, while the ordinates indicate the voltage.

First, as apparent from FIG. 19, in the differential sense amplifier circuit 100A of FIG. 15, the completion signal DONE_X indicating that the logic is defined is completely amplified from 0V up to the power supply voltage level.

Further, the waveform of the logic output H intersects with the amplitude near the center value, so it can be said that the transition timing is ideal.

Accordingly, according to the differential sense amplifier circuit 100A of FIG. 15, the first problem of the prior art is solved.

As apparent when viewing FIG. 16, in the idle phase before the switch to the working phase, the logic outputs H and H_X have become the ideal 0V.

Further, as shown in FIG. 17, in the differential sense amplifier circuit 100A of FIG. 15, when the phase switches to the idle phase, the logic outputs are smoothly reduced to 0V.

Accordingly, according to the differential sense amplifier circuit 100A of FIG. 15, the second problem of the prior art that the logic outputs H and H_X do not become 0V in the idle phase, but rise by the amount of the NMOS threshold voltage and therefore the leakage current becomes large is solved.

Further, as clear when viewing FIG. 18, in the present invention, no malfunction is observed.

There is a period during which the potential of the logic output H becomes lower than the logic output H_X under the influence of the falling of the noise NZ1 in the evaluation use model 30 of FIG. 7.

In the sense amplifier circuit of the DCSL3 type, the potential difference is increased as it is.

In the sense amplifier circuit of FIG. 15, however, as shown in FIG. 18, a situation where the potential difference of the noise is reversed and the potentials of the logic outputs H and H_X converge toward the correct logic value is exhibited.

This phenomenon is realized by the action of the control mechanism of the cutoff of the logic tree by a dynamic NOR circuit D-NORA configured by the PMOS transistor PT104 and the NMOS transistors NT107 and NT108 possessed by the sense amplifier circuit 100A.

Accordingly, according to the differential sense amplifier circuit 100A of FIG. 15, the third problem of the prior art that the sense amplifier ends up defining an erroneous value due to the coupling noise is solved.

As explained above, a malfunction due to the coupling noise depends upon the height of the logic tree and the power supply voltage.

In general, the lower the power supply voltage and the higher the logic tree, the easier a malfunction due to the coupling noise.

Further, in FIG. 14, showing the lowest power supply voltage at which the normal operation is carried out even in the case where coupling noise is given, the sense amplifier circuit 100A of FIG. 15 is indicated as the P2 type.

As explained above, the height of the logic tree of EXOR is equal to the input order thereof.

As apparent from FIG. 14, in the conventional sense amplifier circuit of the DCSL3 type, a malfunction occurs, even if the power supply voltage is high and the logic tree is low.

On the other hand, in an EXOR logic using the P2 type sense amplifier circuit 100A according to the present invention, operation is possible even at a voltage lower than 1.5V though depending upon the conditions. Further, in this P2 type sense amplifier circuit 100A, no malfunction occurs even near 0.7V.

Accordingly, if a dynamic logic circuit is configured by using the sense amplifier circuit 100A of FIG. 15, a dynamic logic circuit operating stably at a low power supply voltage can be realized.

In the same way as the sense amplifier circuit of FIG. 9, the sense amplifier circuit 100A of FIG. 15 contributes to a great reduction of the power consumption of the CMOS semiconductor integrated circuit.

As explained above, according to the second embodiment, similar effects to the effects of the first embodiment mentioned above can be obtained.

Third Embodiment

Figure 20:
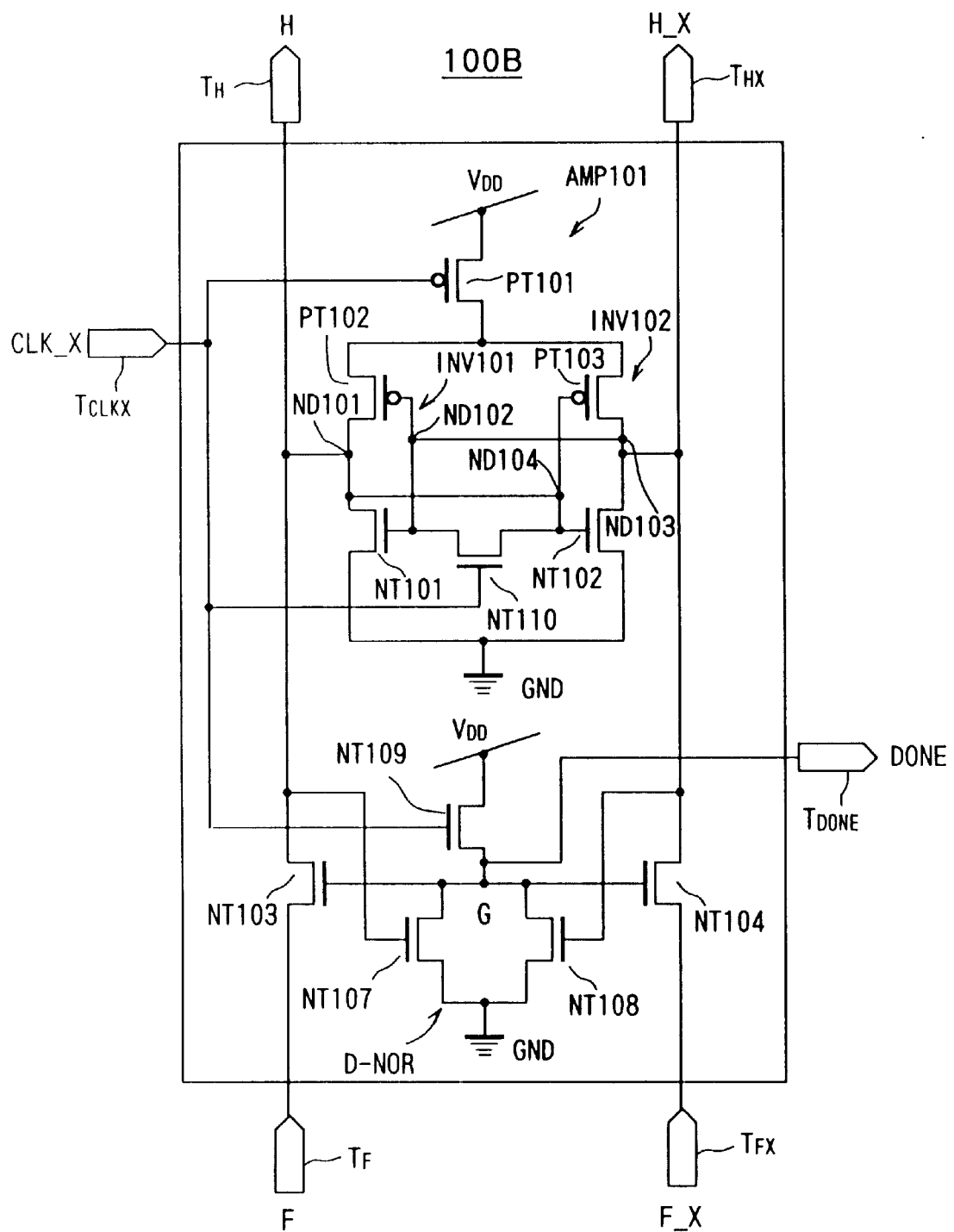
FIG. 20 is a circuit diagram of a third embodiment of the differential sense amplifier circuit according to the present invention.

FIG. 20 is a circuit diagram of a third embodiment of the differential sense amplifier circuit according to the present invention.

The point of difference of the present third embodiment from the first embodiment resides in that, in place of the NMOS transistors NT105 and NT106 serving as the discharge means for reducing the logic outputs H and H_X to 0V at the time of the idle phase (CLK_X=1), the input node ND102 of the inverter INV101 and the input node ND104 of the inverter INV102 configuring the sense amplifier AMP101, in other words, the gate of the NMOS transistor NT101 and the gate of the NMOS transistor NT102, are connected by the NMOS transistor NT110, and the gate of the NMOS transistor NT110 is connected to the clock input terminal TCLKX of the clock inverted signal CLK_X.

The behavior of this differential sense amplifier circuit 100B in the working phase is similar to that of the sense amplifier circuit of FIG. 9 except concerning the NMOS transistor NT110, so the explanation thereof will be omitted.

Below, an explanation will be made of the operation of the sense amplifier circuit 100B of FIG. 20 focusing on the points different from the operation of the sense amplifier circuit of FIG. 9.

When the phase switches from the working phase to the idle phase, the clock inverted signal CLK_X switched from the logic "0" to the logic "1", and the NMOS transistor NT110 becomes ON. As a result, the logic output terminals TH and THX are electrically connected, and a balanced state of charges to formed.

Accordingly, the potentials of the logic outputs H and H_X become near the threshold values of the NMOS transistors NT101 and NT102.

By this, the NMOS transistors NT107 and NT108 of the D-NOR configuring the dynamic NOR circuit become out off.

At this time, the precharge use NMOS transistor NT109 becomes ON along with the switch of the clock inverted signal CLK_X from the logic "0" to the logic "1".

The charges are supplied to the control node G through the NMOS transistor NT109.

As a result, the control node G connected to the gates of the NMOS transistors NT103 and NT104 for cutting off the logic tree is precharged up to substantially a power supply voltage $V_{DD}$ level. In actuality, it is precharged up to $V_{DD}$-Vth (Vth is the threshold value of the NMOS transistor). This precharge voltage is a voltage large enough to turn on the NMOS transistors NT103 and NT104 to an extent that the current flows therethrough.

By this, the NMOS transistors NT103 and NT104 becomes ON to such an extent that they allow the current to pass therethrough, and the sense amplifier AMP101 and the not illustrated logic tree connected to the logic input terminals TF and TFX are electrically connected.

Namely, the sense amplifier AMP101 and the logic tree are electrically connected again in the idle phase.

Then, one of the logic input terminals TF and TFX always has a route reaching the ground and draws out the charges remaining in the logic output terminals TH and THX through one of the NMOS transistors NT103 and NT104.

As a result, the potentials of the logic outputs H and H_X are reduced down to 0V. For example, when the logic input F has a route reaching the ground, the charge of the logic output H is drawn out through the NMOS transistor NT103.

On the other hand, the charge is drawn out through the NMOS transistor NT103 after passing through the NMOS transistor NT110.

The sense amplifier circuit 100B of FIG. 20 was used to configure the 4-input EXOR dynamic logic circuit 300 as shown in FIG. 10 for simulation. Further, also the resistance to noise was similarly evaluated.

Figure 21:
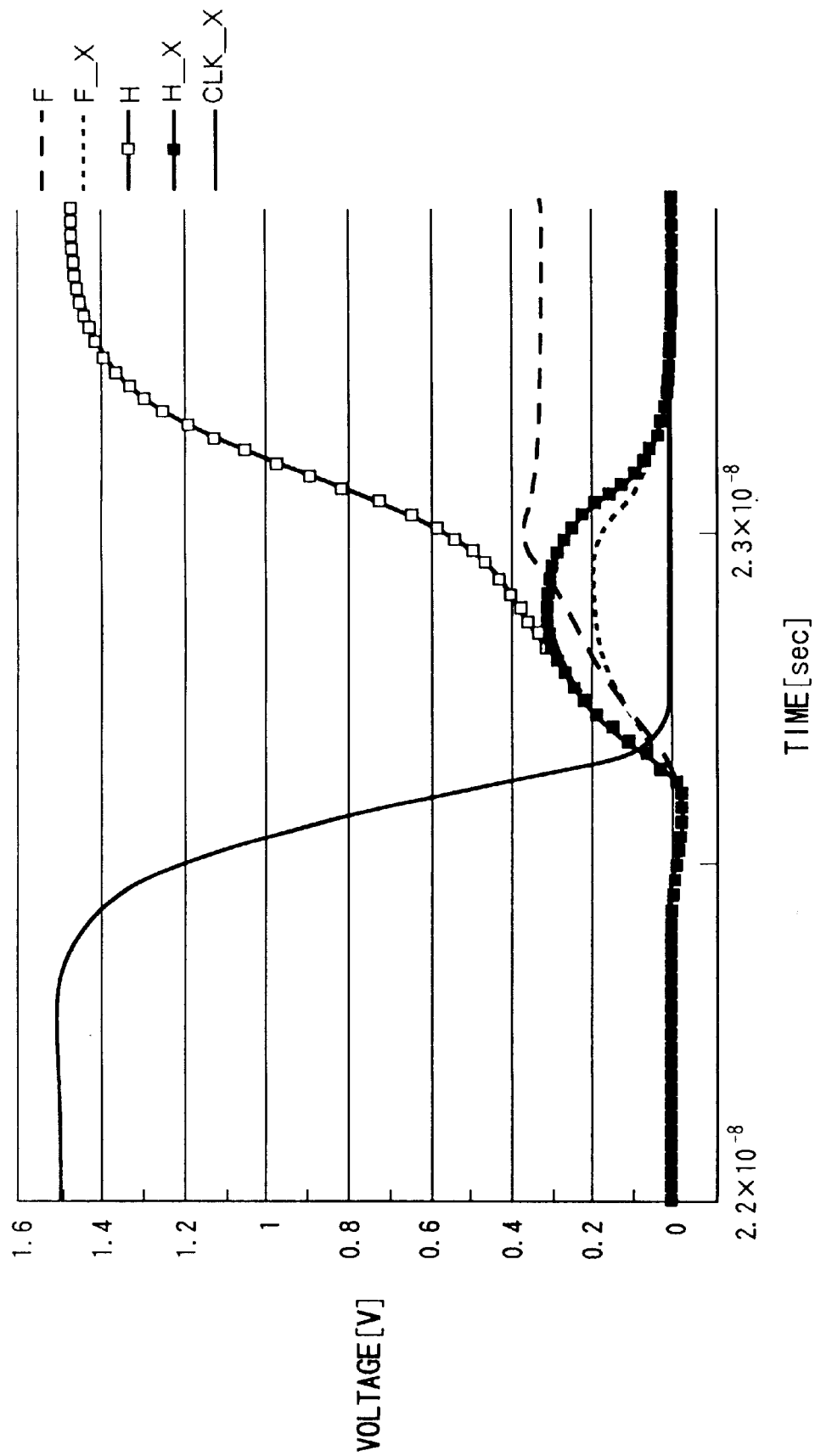
FIG. 21 is a view of the waveform when the sense amplifier circuit of FIG. 20 where no noise is given switches to the working phase.
Figure 22:
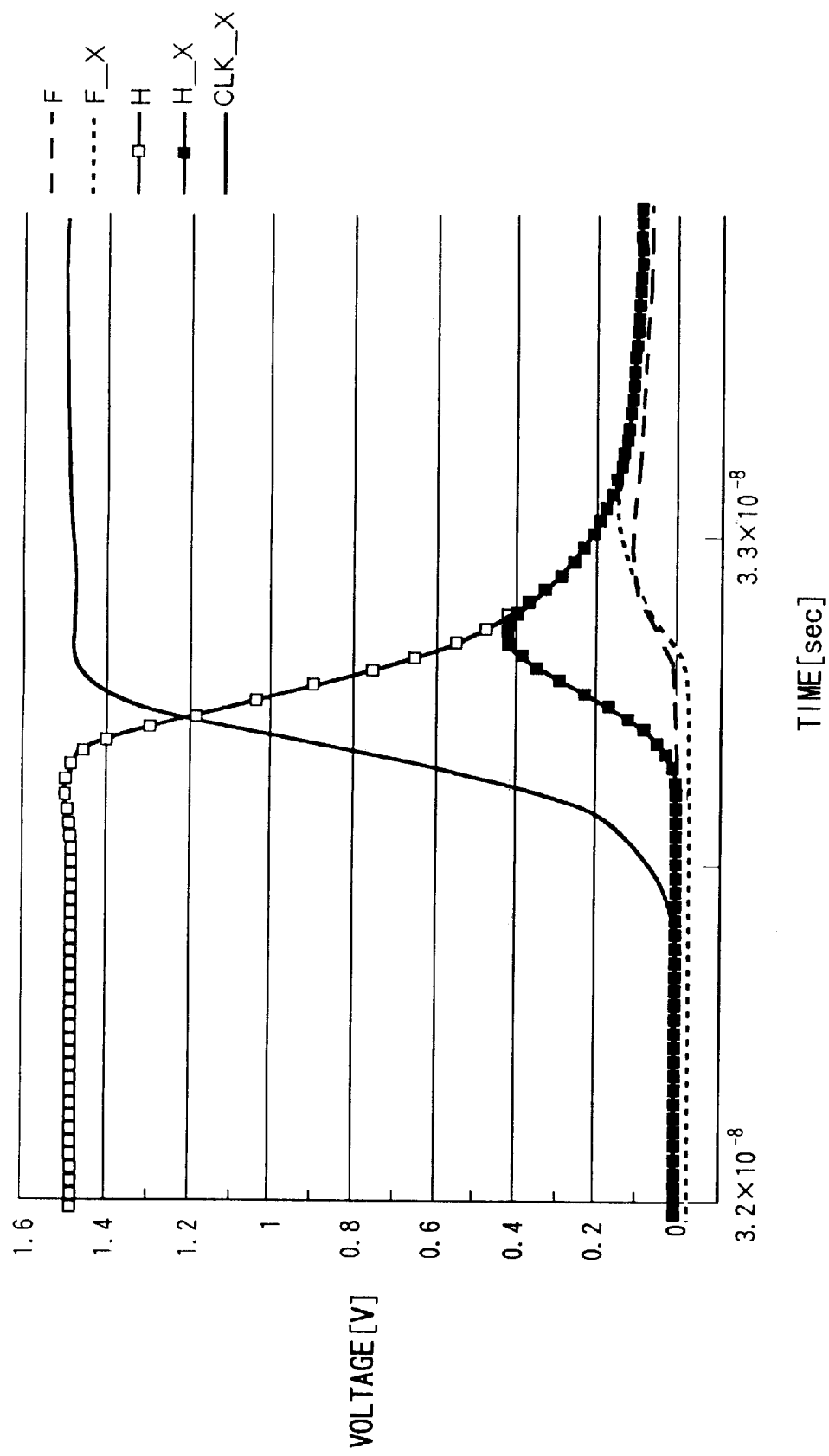
FIG. 22 is a view of the waveform when the sense amplifier circuit of FIG. 20 where no noise is given switches to the idle phase.
Figure 23:
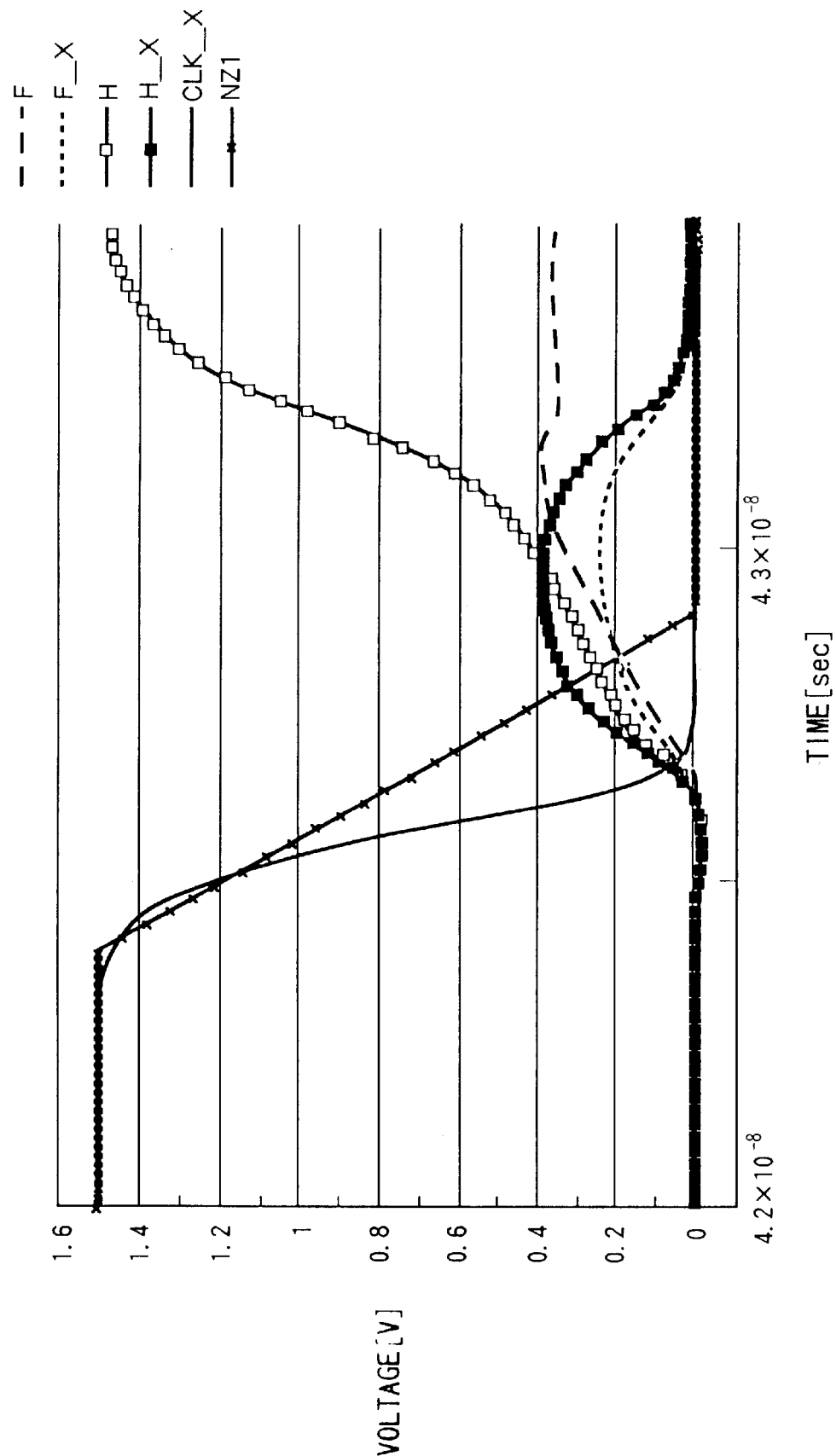
FIG. 23 is a view of the waveform when the sense amplifier circuit of FIG. 20 where noise is given switches to the working phase.

FIG. 21 is a view of the waveform when the sense amplifier circuit 100B of FIG. 20 where no noise is given switches to the working phase, FIG. 22 is a view of the waveform when the sense amplifier circuit 100B of FIG. 20 where no noise is given switches to the idle phase, and FIG. 23 is a view of the waveform when the sense amplifier circuit 100B of FIG. 20 where noise is given switches to the working phase.

In FIG. 21, FIG. 22, and FIG. 23, the abscissas indicate the time, and the ordinates indicate the voltage.

First, although not illustrated in the figure, the differential sense amplifier circuit 100B of FIG. 20 amplifies the completion signal DONE_X indicating that the logic is defined from 0V up to substantially the power supply voltage level.

Accordingly, according to the differential sense amplifier circuit 100B of FIG. 20, the first problem of the prior art is solved.

As apparent when viewing FIG. 21, in the idle phase before the switch to the working phase, the logic outputs H and H_X have become the ideal 0V.

Further, as shown in FIG. 22, in the differential sense amplifier circuit 100B of FIG. 20, when the phase switches to the idle phase, the logic outputs are smoothly reduced to 0V.

Accordingly, according to the differential sense amplifier circuit 100B of FIG. 20, the second problem of the prior art that the logic outputs H and H_X do not become 0V in the idle phase, but rise by the amount of the NMOS threshold voltage and therefore the leakage current becomes large is solved.

Further, as apparent when viewing FIG. 23, in the present invention, no malfunction is observed.

There is a period during which the potential of the logic output H becomes lower than the logic output H_X under the influence of the falling of the noise NZ1 in the evaluation use model 30 of FIG. 7.

In the sense amplifier circuit of the DCSL3 type, the potential difference was increased as it is.

In the sense amplifier circuit of FIG. 20, however, as shown in FIG. 23, the situation where the potential difference of the noise is reversed and the potentials of the logic outputs H and H_X converge toward the correct logic value is exhibited.

This phenomenon is realized by the action of the control mechanism of the cutoff of the logic tree by a dynamic NOR circuit D-NOR configured by the NMOS transistors NT107 to NT109 possessed by the sense amplifier circuit 100B.

Accordingly, according the differential sense amplifier circuit 100B of FIG. 20, the third problem of the prior art that the sense amplifier defines an erroneous value due to the coupling noise is solved.

As mentioned above, the malfunction due to the coupling noise depends upon the height of the logic tree and the power supply voltage.

In general, the lower the power supply voltage and the higher the logic tree, the easier a malfunction due to the coupling noise.

Further, in FIG. 14 showing the lowest power supply voltage at which the normal operation is carried out even in the case where coupling noise is given, the sense amplifier circuit 100B of FIG. 20 is indicated as the N3 type.

As explained above, the height of the logic tree of EXOR is equal to the input order thereof.

As apparent from FIG. 14, in the conventional sense amplifier circuit of the DCSL3 type, a malfunction occurs even if the power supply voltage is high and the logic tree is low.

On the other hand, in an EXOR logic using the N3 type sense amplifier circuit 100B according to the present invention, operation is possible even at a voltage lower than approximately 1.5V though depending upon the conditions.

Accordingly, if the dynamic logic circuit is configured by using the sense amplifier circuit 100B of FIG. 20, a dynamic logic circuit operating stably at a low power supply voltage can be realized.

Then, in the same way as the sense amplifier circuit of FIG. 9, the sense amplifier circuit 100B of FIG. 20 contributes to a great reduction of the power consumption of the CMOS semiconductor integrated circuit.

As explained above, according to the present third embodiment, similar effects to the effects of the first embodiment mentioned above can be obtained.

Fourth Embodiment

Figure 24:
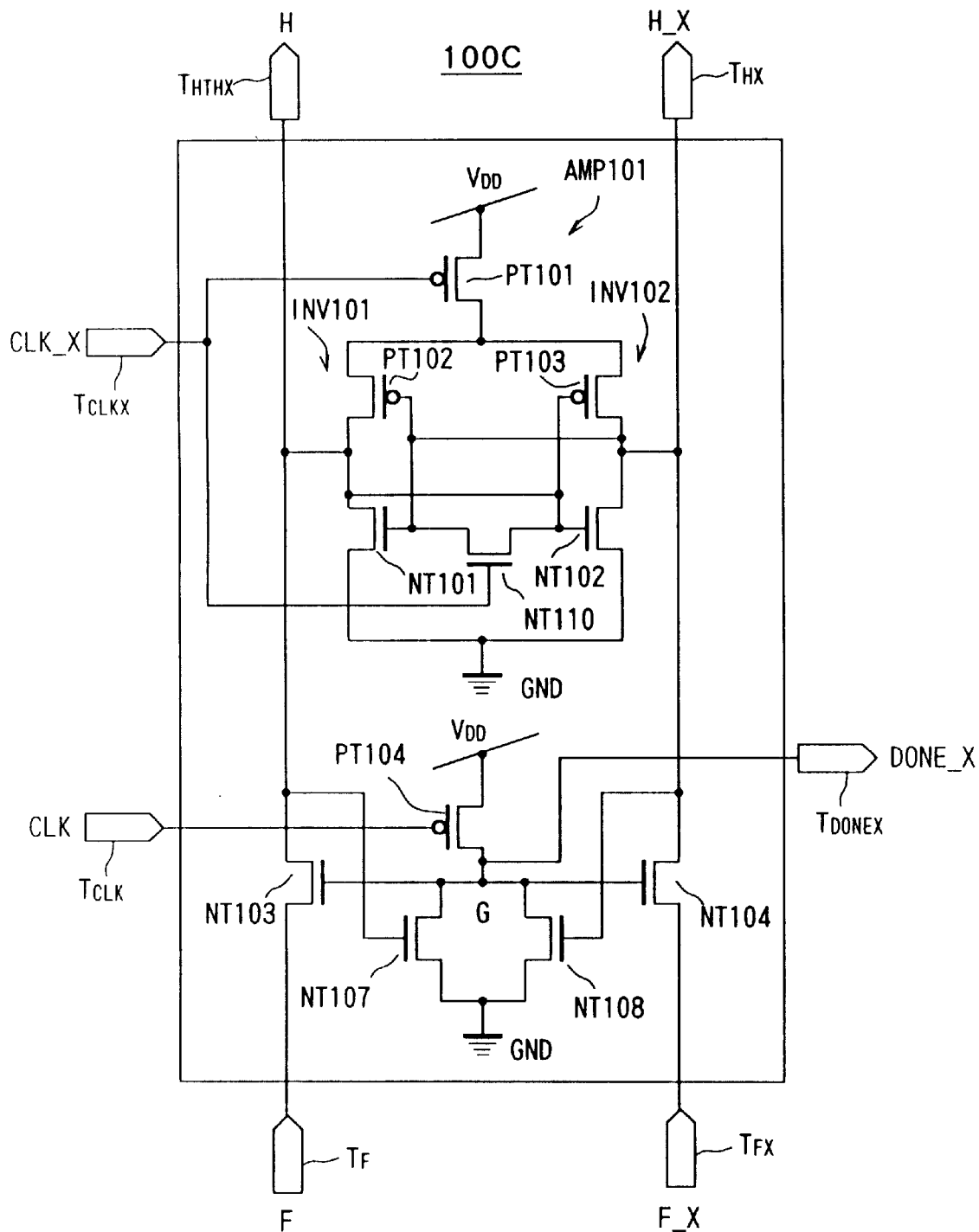
FIG. 24 is a circuit diagram of a fourth embodiment of the differential sense amplifier circuit according to the present invention.

FIG. 24 is a circuit diagram of a fourth embodiment of the differential sense amplifier circuit according to the present invention.

The point of difference of the present fourth embodiment from the third embodiment resides in that the supply line of the power supply voltage $V_{DD}$ of the dynamic NOR circuit and the control node G are connected by the precharge use PMOS transistor PT104 in place of the precharge use NMOS transistor, and the gate of the PMOS transistor PT104 is connected to the clock input terminal TCLK of the clock signal CLK in place of the clock input terminal TCLKX of the clock inverted signal CLK_X.

The rest of the configuration and functions are similar to those of the third embodiment mentioned above, so a detailed explanation thereof will be omitted.

The sense amplifier circuit 100C of FIG. 24 was used to configure a 4-input EXOR dynamic logic circuit 300 as shown in FIG. 10 for simulation. Further, the resistance to noise was similarly evaluated.

Figure 25:
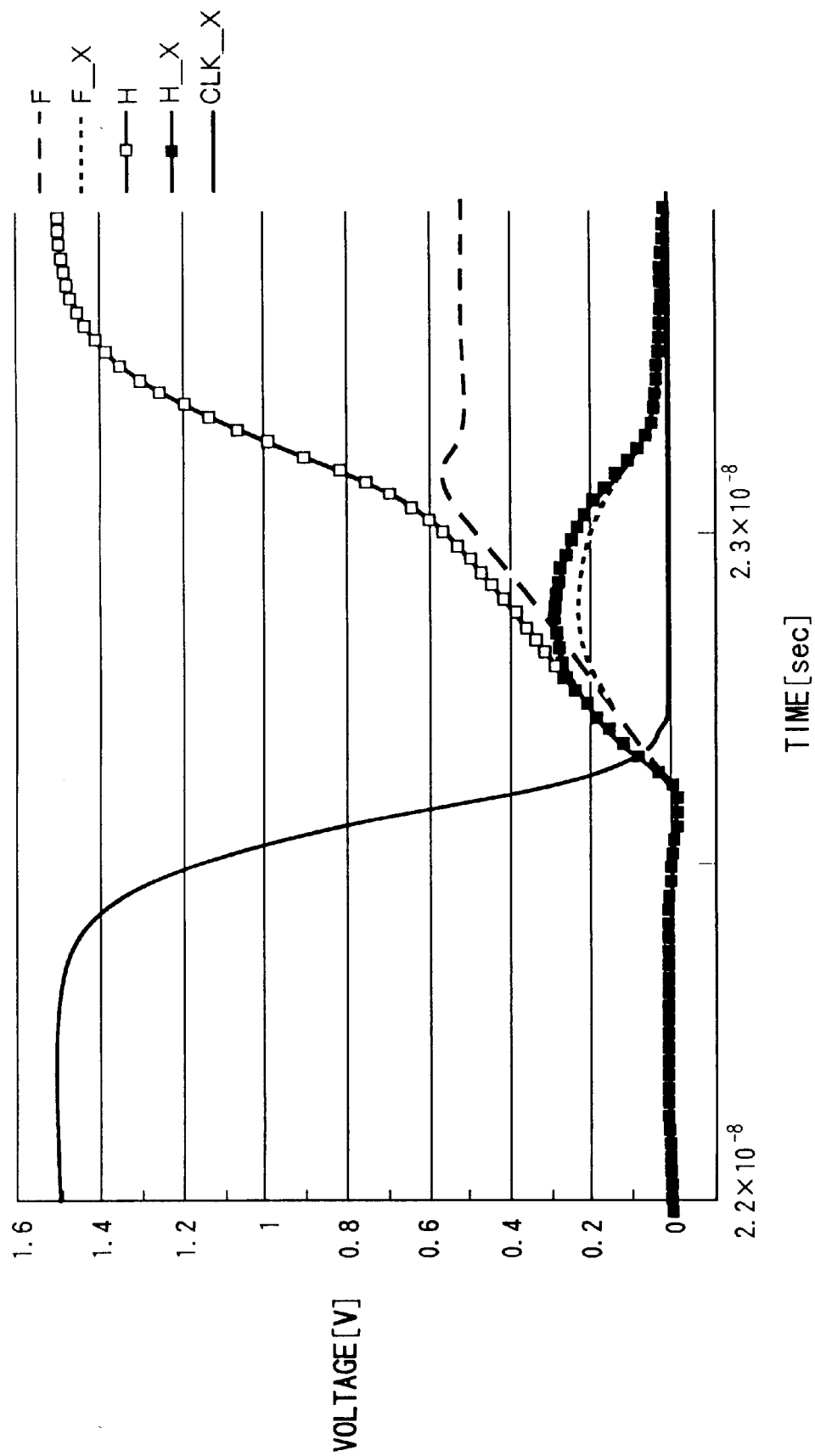
FIG. 25 is a view of the waveform when the sense amplifier circuit of FIG. 24 where no noise is given switches to the working phase.
Figure 26:
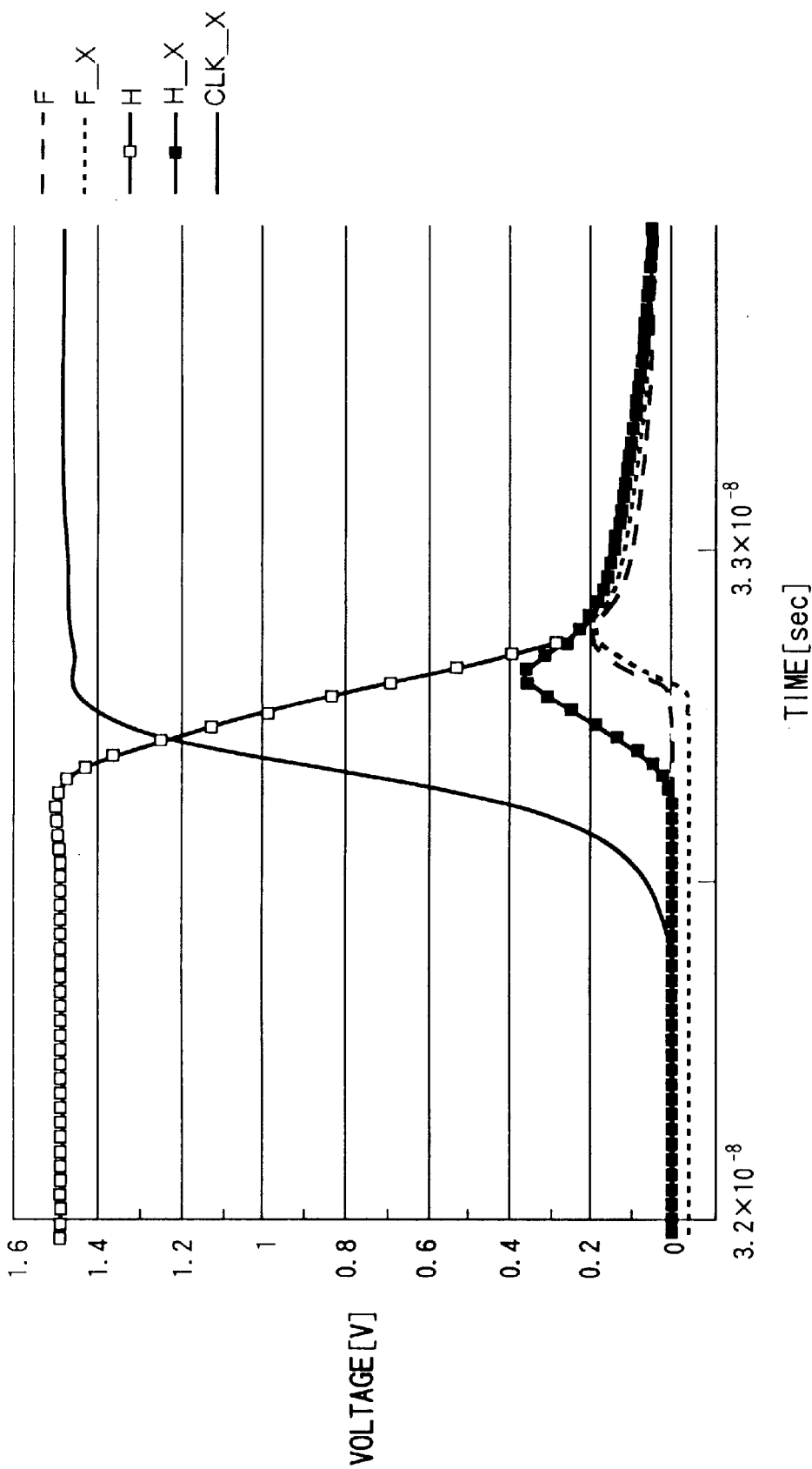
FIG. 26 is a view of the waveform when the sense amplifier circuit of FIG. 24 where no noise is given switches to the idle phase.
Figure 27:
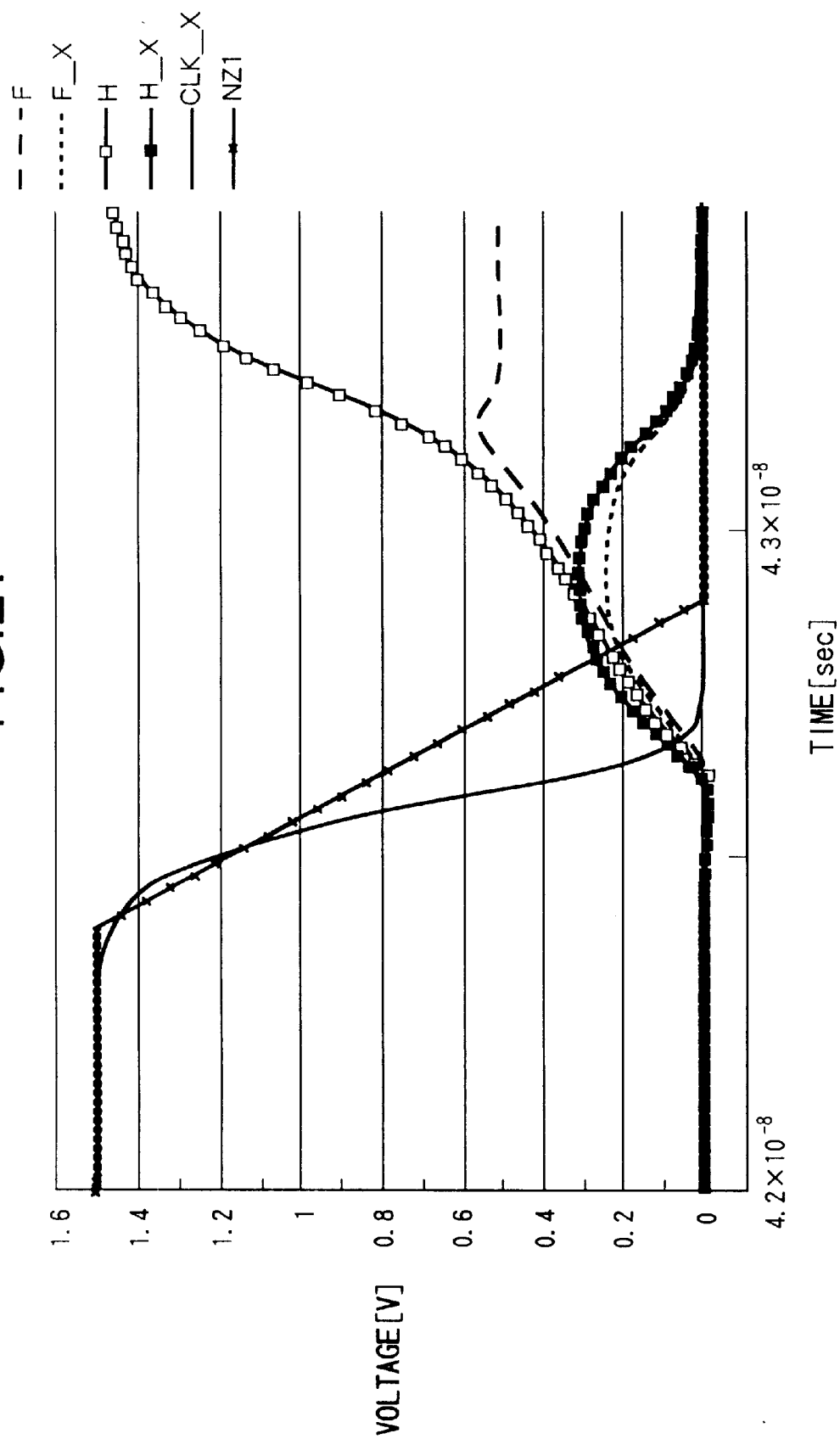
FIG. 27 is a view of the waveform when the sense amplifier circuit of FIG. 24 where noise is given switches to the working phase.

FIG. 25 is a view of the waveform when the sense amplifier circuit 100C of FIG. 24 where no noise is given switches to the working phase, FIG. 26 is a view of the waveform when the sense amplifier circuit 100C of FIG. 24 where no noise is given switches to the idle phase, and FIG. 27 is a view of the waveform when the sense amplifier circuit 100C of FIG. 24 where noise is given switches to the working phase.

Figure 28:
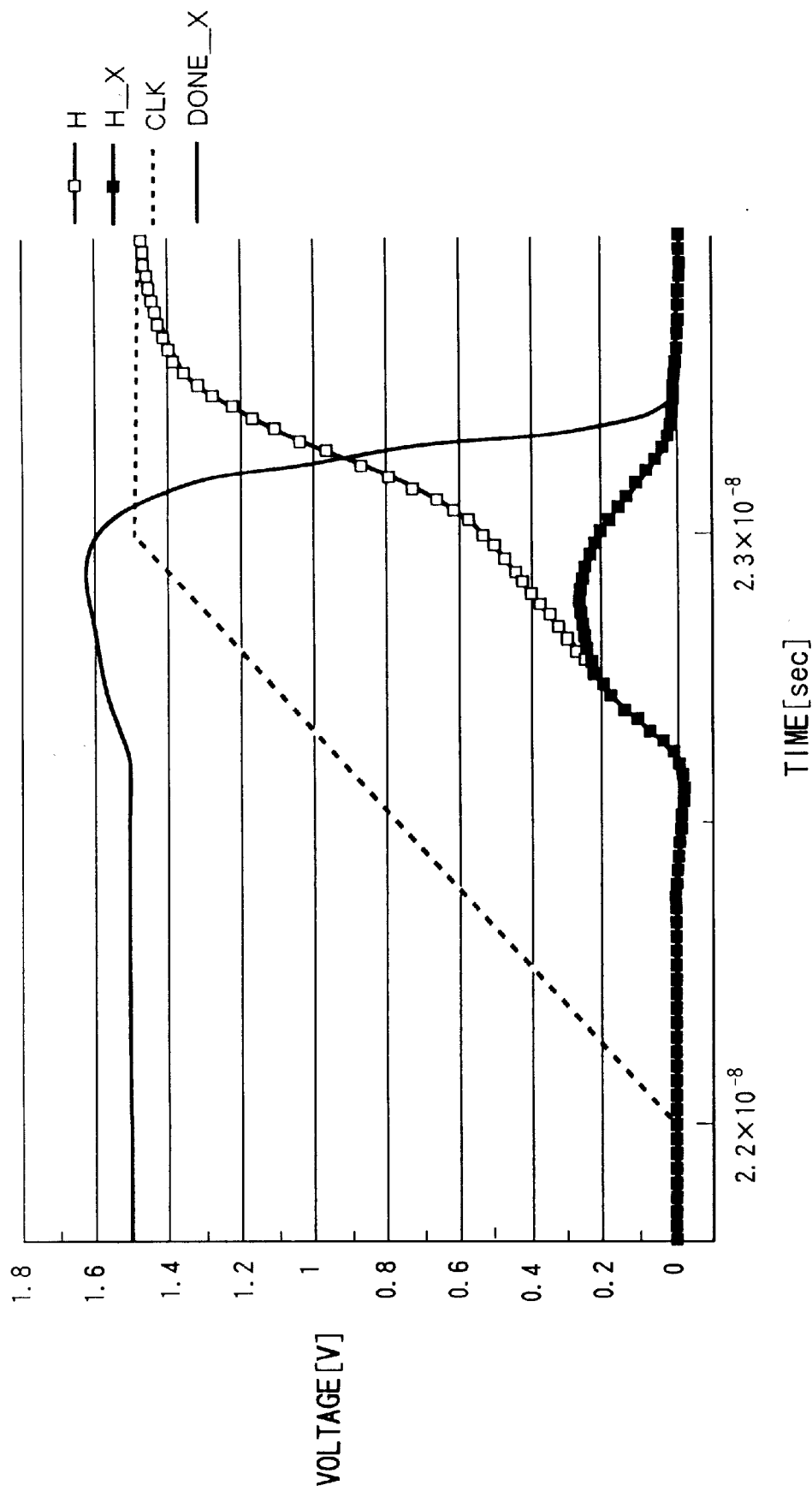
FIG. 28 is a view of the waveform of the completion signal DONE_X in the sense amplifier circuit of FIG. 24.

Further, FIG. 28 is a view of the waveform of the completion signal DONE_X in the sense amplifier circuit 100C of FIG. 24.

In FIG. 25, FIG. 26, FIG. 27, and FIG. 28, the abscissas indicate the time, and the ordinates indicate the voltage.

First, as apparent from FIG. 28, the differential sense amplifier circuit 100C of FIG. 24 amplifies the completion signal DONE_X indicating that the logic is defined completely from 0V up to the power supply voltage level.

Further, the waveform of the logic output H intersects the amplitude near its center value, so it can be said that the transition timing is ideal.

Accordingly, according to the differential sense amplifier circuit 100C of FIG. 24, the first problem of the prior art is solved.

As apparent when viewing FIG. 25, in the idle phase before the switch to the working phase, the logic outputs H and H_X have become the ideal 0V.

Further, as shown in FIG. 26, in the differential sense amplifier circuit 100C of FIG. 24, when the phase switches to the idle phase, the logic outputs are smoothly reduced to 0V.

Accordingly, according to the differential sense amplifier circuit 100C of FIG. 24, the second problem of the prior art that the logic outputs H and H_X do not become 0V in the idle phase, but rise by the amount of the NMOS threshold voltage and therefore the leakage current becomes large is solved.

Further, as apparent when viewing FIG. 27, in the present invention, no malfunction is observed.

There is a period during which the potential of the logic output H becomes lower than the logic output H_X under the influence of the falling of the noise NZ1 in the evaluation use model 30 of FIG. 7.

In the sense amplifier circuit of the DCSL3 type, the potential difference is increased as it is.

In the sense amplifier circuit of FIG. 24, however, as shown in FIG. 27, the situation where the potential difference of the noise is reversed, and the potentials of the logic outputs H and H_X converge toward the correct logic value is exhibited.

This phenomenon is realized by the action of the control mechanism of the cutoff of the logic tree by a dynamic NOR circuit D-NORA configured by the PMOS transistor PT104 and the NMOS transistors NT107 and NT108 possessed by the sense amplifier circuit 100C.

Accordingly, according to the differential sense amplifier circuit 100C of FIG. 24, the third problem of the prior art that the sense amplifier ended up defining an erroneous value due to the coupling noise is solved.

As explained above, a malfunction due to the coupling noise depends upon the height of the logic tree and the power supply voltage.

In general, the lower the power supply voltage and the higher the logic tree, the easier a malfunction due to the coupling noise.

Further, in FIG. 14 showing the lowest power supply voltage at which the normal operation is carried out even in the case where coupling noise is given, the sense amplifier circuit 100C of FIG. 24 is indicated as the P3 type.

As explained above, the height of the logic tree of EXOR is equal to the input order.

As apparent from FIG. 14, in the conventional sense amplifier circuit of the DCSL3 type, a malfunction occurs even if the power supply voltage is high and the logic tree is low.

On the other hand, in an EXOR logic using the P3 type sense amplifier circuit 100C according to the present invention, operation is possible even at a voltage lower than 1.5V though depending upon the conditions. In this P3 type sense amplifier circuit 100C, no malfunction occurs even near 0.7V.

Accordingly, if the sense amplifier circuit 100C of FIG. 24 is used to configure the dynamic logic circuit, a dynamic logic circuit operating stably at a low power supply voltage can be realized.

Then, in the same way as the sense amplifier circuit of FIG. 9, the sense amplifier circuit 100C of FIG. 24 contributes to a great reduction of the power consumption of a CMOS semiconductor integrated circuit.

As explained above, according to the present fourth embodiment, similar effects to the effects of the first embodiment and the second embodiment mentioned above can be obtained.

Fifth Embodiment

Figure 29:
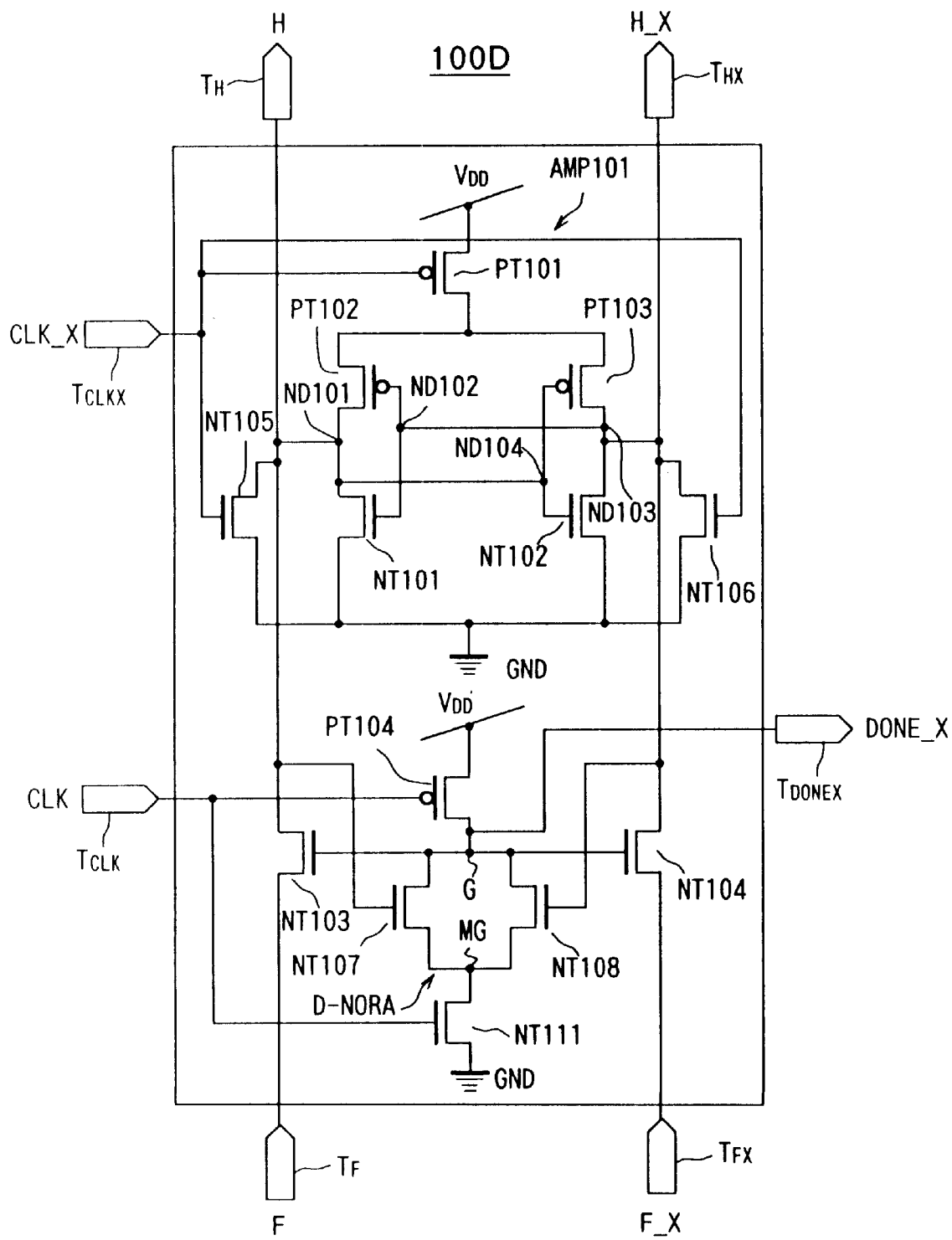
FIG. 29 is a circuit diagram of a fifth embodiment of the differential sense amplifier circuit according to the present invention.

FIG. 29 is a circuit diagram of a fifth embodiment of the differential sense amplifier circuit according to the present invention.

The point of difference of the present fifth embodiment from the second embodiment mentioned above resides in that an NMOS transistor NT111 is connected between an intermediate node MG as the connection point of the sources of the NMOS transistors NT107 and NT108 configuring the connection controlling means for cutting off the logic tree and the ground, and the gate of this NMOS transistor NT111 is connected to the clock input terminal TCLK.

The basic operation principle becomes the same as that of the second embodiment shown in FIG. 15. For this reason, a detailed explanation will be omitted.

The slight difference of the operation due to the addition of the NMOS transistor NT111 resides in the process of transition from the working phase to the idle phase.

In this transition state, the turning ON of the PMOS transistor PT104 and the cutting off of the NMOS transistors NT107 and NT108 do not simultaneously occur.

To cut off the NMOS transistors NT107 and NT108, a process of equally distributing the charges on the nodes TH and TH_X and releasing the charges by the NMOS diode becomes necessary.

For this reason, in the second embodiment of FIG. 15, there is an instant when a penetration current flows through either of the NMOS transistor NT107 or NT108 after the PMOS transistor PT104 becomes ON.

Contrary to this, in the fifth embodiment shown in FIG. 29, the penetration current as described above is not generated.

This is because, simultaneously with the turning ON of the PMOS transistor PT104, the NMOS transistor NT111 becomes cut off synchronous to the same clock signal CLK.

According to the present fifth embodiment, in addition to the effect of the second embodiment mentioned above, there is an advantage that a reduction of the power consumption can be achieved.

Further, needless to say the dynamic logic circuit as shown in FIG. 10 can be realized by using a sense amplifier circuit 100D of FIG. 29.

Sixth Embodiment

Figure 30:
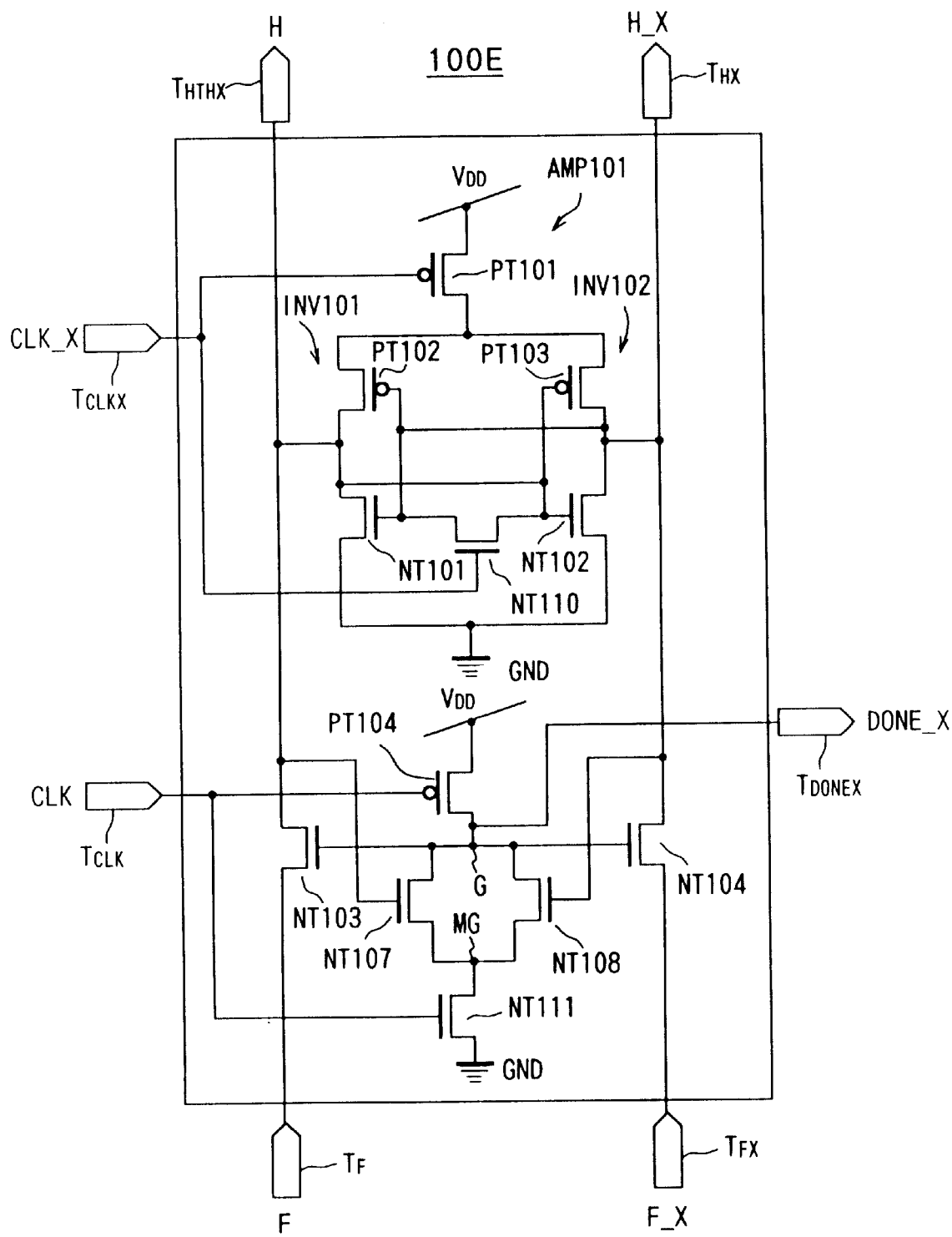
FIG. 30 is a circuit diagram of a sixth embodiment of the differential sense amplifier circuit according to the present invention.

FIG. 30 is a circuit diagram of a sixth embodiment of the differential sense amplifier circuit according to the present invention.

The point of difference of the present sixth embodiment from the fourth embodiment mentioned above resides in that an NMOS transistor NT111 is connected between an intermediate node MG as the connection point of the sources of the NMOS transistors NT107 and NT108 configuring the connection controlling means for cutting off the logic tree and the ground, and the gate of this NMOS transistor NT111 is connected to the clock input terminal TCLK.

The basic operation principle becomes the same as that of the fourth embodiment shown in FIG. 24. For this reason, a detailed explanation will be omitted.

The slight difference of the operation due to the addition of the NMOS transistor NT111 resides in the process of transition from the working phase to the idle phase.

In this transition state, the turning ON of the PMOS transistor PT104 and the cutting off of the NMOS transistors NT107 and NT108 do not simultaneously occur.

To out off the NMOS transistors NT107 and NT108, a process of equally distributing the charges on the nodes TH and TH_X and releasing the charges by the NMOS diode becomes necessary.

For this reason, in the fourth embodiment of FIG. 24, there is an instant when a penetration current flows through either of the NMOS transistor NT107 or NT108 after the PMOS transistor PT104 becomes ON.

Contrary to this, in the sixth embodiment shown in FIG. 30, the penetration current as described above is not generated.

This is because, simultaneously with the turning ON of the PMOS transistor PT104, the NMOS transistor NT111 becomes cut off synchronous to the same clock signal CLK.

According to the present sixth embodiment, in addition to the effect of the fourth embodiment mentioned above, there is an advantage such that a reduction of the power consumption can be achieved.

Further, needless to say the dynamic logic circuit as shown in FIG. 10 can be realized by using a sense amplifier circuit 100E of FIG. 30.

Seventh Embodiment

Figure 31:
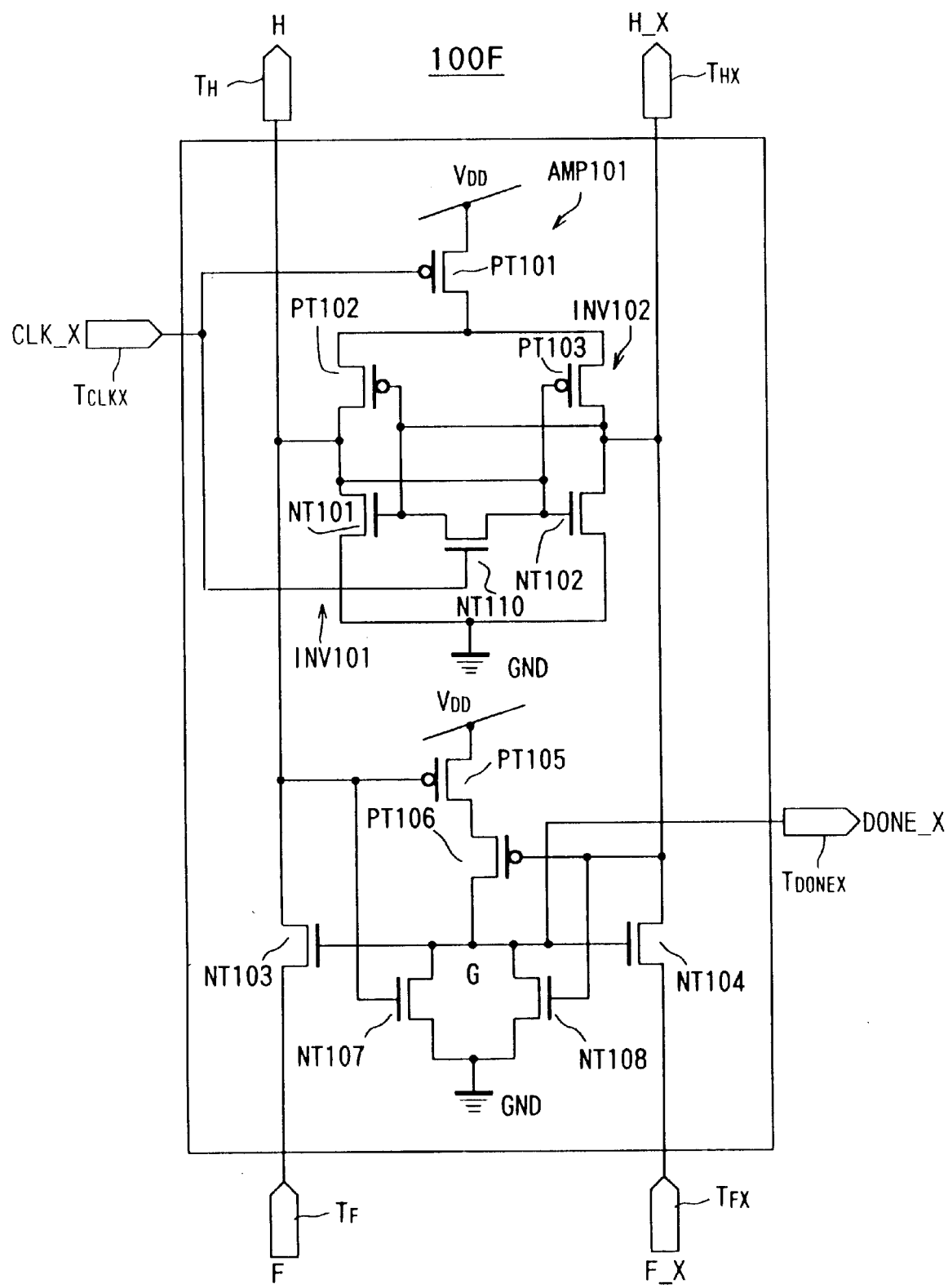
FIG. 31 is a circuit diagram of a seventh embodiment of the differential sense amplifier circuit according to the present invention.

FIG. 31 is a circuit diagram of a seventh embodiment of the differential sense amplifier circuit according to the present invention.

The point of difference of the present seventh embodiment from the third embodiment mentioned above resides in that the supply line of the power supply voltage $V_{DD}$ of the dynamic NOR circuit and the control node G are connected by two PMOS transistors PT105 and PT106 connected in series in place of the precharge use NMOS transistor, the gate of the PMOS transistor PT105 is connected to the logic output terminal TH and the gate of the PMOS transistor PT106 is connected to the logic output terminal THX, and the control mechanism of the cutoff of the logic tree is configured by a static NOR circuit S-NOR.

The rest of the configuration and functions are similar to those of the third embodiment mentioned above.

In the present seventh embodiment, the voltage of the control node G is determined by viewing the logic voltages of the nodes TH and TH_X not depending upon the clock signal CLK so as to control the cutoff of the logic tree.

Namely, from the fact that both of the nodes TH and TH_X have the logic "0" in the idle phase, the control node G is made the logic "1", and the control node G is made the logic "0" at the point of time when either of the nodes TH and TH_X becomes the logic "1" in the working phase.

Since the PMOS transistors PT105 and PT106 are connected in series, the current does not flow until both of the nodes TH and TH_X return to the logic "0", so no penetration current is generated.

According to the present seventh embodiment, in addition to the effects of the third embodiment mentioned above, there is an advantage that a reduction of the power consumption can be achieved.

Further, according to the present seventh embodiment, the clock signal CLK is not required for the control of the cutoff of the logic tree, therefore additions for the clock signal CLK can be reduced.

Further, needless to say the dynamic logic circuit as shown in FIG. 10 can be realized by using a sense amplifier circuit 100F shown in FIG. 31.

Summarizing the effects of the invention as explained above, according to the present invention, a completion signal not causing a malfunction of a latter logic circuit can be generated and the power consumption when the circuit is stopped can be reduced.

Further, according to the present invention, a practical differential sense amplifier circuit free from the apprehension of the occurrence of a malfunction due to the coupling noise and a dynamic logic circuit using the same can be realized.

While the invention has been described with reference to specific embodiment chosen for purpose of illustration, it should be apparent that numerous modifications could be made thereto by those skilled in the art without departing from the basic concept and scope of the invention.

What is claimed is:

1. A differential sense amplifier circuit alternating between two phases of an idle phase and working phase according to a control signal, comprising:
    a first logic input terminal,
    a second logic input terminal,
    a first logic output terminal,
    a second logic output terminal,
    a sense amplifier which has a first inverter, and a second inverter, in which
    the output of the first inverter and the input of the second inverter are connected, a connection point thereof is connected to the first logic output terminal, the input of the first inverter and the output of the second inverter are connected, and the connection point thereof is connected to the second logic output terminal, and which operates upon receipt of the control signal indicating the working phase to define logic potentials of the first logic output and the second logic output at a different first level and second level according to a difference of conduction resistances possessed by the first logic input and the second logic input,
    initializing means for initializing the first logic input terminal and the second logic input terminal at a reference potential upon receipt of the control signal indicating the idle phase,
    a first switching means for electrically connecting or cutting off the first logic input terminal and the first logic output terminal according to the potential of the control terminal,
    a second switching means for electrically connecting or cutting off the second logic input terminal and the second logic output terminal according to the potential of the control terminal, and
    a connection controlling means which has
    a first setting means for setting the potential of the control node connected to the control terminals of the first switching means and the second switching means to a potential that at least can connect two terminals to which the first and second switching means are connected upon receipt of the control signal indicating the idle phase, and a second setting means for setting the potential of the control node to a potential that at least a cut off the two terminals to which the first and second switching means are connected according to the potential of the first logic output terminal or the second logic output terminal at the time of the working phase.

2. A differential sense amplifier circuit as set forth in claim 1, wherein:
    the initializing means includes a first switch element which is connected between the first logic output terminal and the reference potential and becomes conductive by receiving the control signal indicating the idle phase at its control terminal and a second switch means which is connected between the second logic output terminal and the reference potential and becomes conductive by receiving the control signal indicating the idle phase at its control terminal.

3. A differential sense amplifier circuit as set forth in claim 1, wherein:
    the first setting means of the connection controlling means includes a first switch element which is connected between a first power supply potential capable of bringing the first switching means and the second switching means into a connection state and the control node and becomes conductive by receiving the control signal indicating the idle phase at its control terminal and
    the second setting means includes a second switch element which is connected between a second power supply potential capable of bringing the first switching means and the second switching means into a cutoff state and the control node, has a control terminal which is connected to the first logic output terminal, and becomes conductive when the first logic output potential is at the first level, and a third switch element which is connected between the second power supply voltage and the control node, has a control terminal which is connected to the second logic output terminal, and becomes conductive when the second logic output potential is at the first level.

4. A differential sense amplifier circuit as set forth in claim 2, wherein:

the first setting means of the connection controlling means includes a third switch element which is connected between a first power supply potential capable of bringing the first switching means and the second switching means into a connection state and the control node and becomes conductive by receiving the control signal indicating the idle phase at its control terminal and the second setting means includes a fourth switch element which is connected between a second power supply voltage capable of bringing the first switching means and the second switching means into the cutoff state and the control node, has a control terminal which is connected to the first logic output terminal, and becomes conductive when the first logic output potential is at the first level, and a fifth switch element which is connected between the second power supply voltage and the control node, has a control terminal which is connected to the second logic output terminal, and becomes conductive when the second logic output potential is at the first level.

5. A differential sense amplifier circuit as set forth in claim 1, wherein:

the first setting means of the connection controlling means includes a first switch element which is connected between a first power supply potential capable of bringing the first switching means and the second switching means into a connection state and the control node and becomes conductive by receiving the control signal indicating the idle phase at its control terminal and the second setting means includes a second switch element which is connected between an intermediate node and the control node, has a control terminal which is connected to the first logic output terminal, and becomes conductive when the first logic output potential is at the first level, a third switch element which is connected between the intermediate node and the control node, has a control terminal which is connected to the second logic output node, and becomes conductive when the second logic output potential is at the first level, and a fourth switch element which is connected between a second power supply potential capable of bringing the first switching means and the second switching means into the cutoff state and an intermediate node, is held in a nonconductive state when the first switch element becomes conductive, and becomes conductive when the first switch element is held in the nonconductive state.

6. A differential sense amplifier circuit as set forth in claim 2, wherein:

the first setting means of the connection controlling means includes a third switch element which is connected between a first power supply potential capable of bringing the first switching means and the second switching means into the connection state and the control node and becomes conductive by receiving the control signal indicating the idle phase at its control terminal and the second setting means includes a fourth switch element which is connected between the intermediate node and the control node, has a control terminal which is connected to the first logic output terminal, and becomes conductive when the first logic output potential is at the first level, a fifth switch element which is connected between the intermediate node and the control node, has a control terminal which is connected to the second logic output node, and becomes conductive when the second logic output potential is at the first level, and a sixth switch element which is connected between a second power supply potential capable of bringing the first switching means and the second switching means into the cutoff state and the intermediate node, is held in the nonconductive state when the third switch element becomes conductive, and becomes conductive when the third switch element is held in the nonconductive state.

7. A differential sense amplifier circuit as set forth in claim 3, wherein the first switch element of the first setting means includes a charge effect transistor of an n-channel with a gate which is connected to the input terminal of the control signal.

8. A differential sense amplifier circuit as set forth in claim 3, wherein the first switch element of the first setting means includes a charge effect transistor of a p-channel with a gate which is connected to the input terminal of the control signal.

9. A differential sense amplifier circuit as set. forth in claim 4, wherein the third switch element of the first setting means includes a charge effect transistor of an n-channel with a gate which is connected to the input terminal of the control signal.

10. A differential sense amplifier circuit as set forth in claim 4, wherein the third switch element of the first setting means includes a charge effect transistor of a p-channel with a gate which is connected to the input terminal of the control signal.

11. A differential sense amplifier circuit as set forth in claim 5, wherein the first switch element of the first setting means includes a charge effect transistor of an n-channel with a gate which is connected to the input terminal of the control signal.

12. A differential sense amplifier circuit as set forth in claim 6, wherein the third switch element of the first setting means includes a charge effect transistor of a p-channel with a gate which is connected to the input terminal of the control signal.

13. A differential sense amplifier circuit as set forth in claim 1, wherein the connection controlling means outputs a completion signal indicating the logic has been defined from the control node.

14. A differential sense amplifier circuit as set forth in claim 2, wherein the connection controlling means outputs a completion signal indicating the logic has been defined from the control node.

15. A differential sense amplifier circuit as set forth in claim 3, wherein the connection controlling means outputs a completion signal indicating the logic has been defined from the control node.

16. A differential sense amplifier circuit as set forth in claim 7, wherein the connection controlling means outputs a completion signal indicating the logic has been defined from the control node.

17. A differential sense amplifier circuit as set forth in claim 8, wherein the connection controlling means outputs a completion signal indicating the logic has been defined from the control node.

18. A differential sense amplifier circuit as set forth in claim 11, wherein the connection controlling means outputs a completion signal indicating the logic has been defined from the control node.

19. A differential sense amplifier circuit alternating between two phases of an idle phase and a working phase according to a control signal, comprising:
   a first logic input terminal,
   a second logic input terminal,
   a first logic output terminal,
   a second logic output terminal,
   a sense amplifier which has
   a first inverter, and a second inverter, in which
      the output of the first inverter and the input of the second inverter are connected, the connection point thereof is connected to the first logic output terminal, the input of the first inverter and the output of the second inverter are connected, and the connection point thereof is connected to the second logic output terminal, and which operates upon receipt of a control signal indicating the working phase to define logic potentials of the first logic output and the second logic output at a different first level and second level according to the difference of conduction resistances possessed by the first logic input and the second logic input,
   an initializing means for connecting the input of the first inverter and the input of the second inverter upon receipt of a control signal indicating the idle phase,
   a first switching means for electrically connecting or cutting off the first logic input terminal and the first logic output terminal according to the potential of the control terminal,
   a second switching means for electrically connecting or cutting off the second logic input terminal and the second logic output terminal according to the potential of the control terminal, and
   a connection controlling means which has
   a first setting means for setting the potential of the control node connected to the control terminals of the first switching means and the second switching means to a potential that at least can connect two terminals to which the first and second switching means are connected upon receipt of the control signal indicating the idle phase, and a second setting means for setting the potential of the control node to a potential that at least can cut off the two terminals to which the first and second switching means are connected according to the potential of the first logic output terminal or the second logic output terminal at the time of the working phase.

20. A differential sense amplifier circuit as set forth in claim 19, wherein the initializing means includes a first switch element which is connected between the input of the first inverter and the input of the second inverter and becomes conductive upon receipt of the control signal indicating the idle phase at its control terminal.

21. A differential sense amplifier circuit as set forth in claim 19, wherein:
   the first setting means of the connection controlling means includes a first switch element which is connected between a first power supply potential capable of bringing the first switching means and the second switching means into the connection state and the control node and becomes conductive by receiving the control signal indicating the idle phase at its control terminal and
   the second setting means includes a second switch element which is connected between a second power supply potential capable of bringing the first switching means and the second switching means into the cutoff state and the control node, has a control terminal which is connected to the first logic output terminal, and becomes conductive when the first logic output potential is at the first level, and a third switch element which is connected between the second power supply potential and the control node, has a control terminal which is connected to the second logic output terminal, and becomes conductive when the second logic output potential is at the first level.

22. A differential sense amplifier circuit as set forth in claim 20, wherein:
   the first setting means of the connection controlling means includes a second switch element which is connected between a first power supply potential capable of bringing the first switching means and the second switching means into the connection state and the control node and becomes conductive by receiving the control signal indicating the idle phase at its control terminal and
   the second setting means includes a third switch element which is connected between a second power supply potential capable of bringing the first switching means and the second switching means into the cutoff state and the control node, has a control terminal which is connected to the first logic output terminal, and becomes conductive when the first logic output potential is at the first level, and a fourth switch element which is connected between the second power supply potential and the control node, has a control terminal which is connected to the second logic output terminal, and becomes conductive when the second logic output potential is at the first level.

23. A differential sense amplifier circuit as set forth in claim 19, wherein:
   the first setting means of the connection controlling means includes a first switch element which is connected between a first power supply potential capable of bringing the first switching means and the second switching means into the connection state and the control node and becomes conductive by receiving the control signal indicating the idle phase at its control terminal and
   the second setting means includes a second switch element which is connected between an intermediate node and the control node, has a control terminal which is connected to the first logic output terminal, and becomes conductive when the first logic output potential is at the first level, a third switch element which is connected between the intermediate node and the control node, has a control terminal which is connected to the second logic output node, and becomes conductive when the second logic output potential is at the first level, and a fourth switch element which is connected between a second power supply potential capable of bringing the first switching means and the second switching means into the cutoff state and the intermediate node, is held in the nonconductive state when the first switch element becomes conductive, and becomes conductive when the first switch element is held in the nonconductive state.

24. A differential sense amplifier circuit as set forth in claim 20, wherein:
   the first setting means of the connection controlling means includes a second switch element which is connected between a first power supply potential capable of bringing the first switching means and the second switching means into the connection state and the control node and becomes conductive by receiving the control signal indicating the idle phase at its control terminal and the second setting means includes a third switch element which is connected between the intermediate node and the control node, has a control terminal which is connected to the first logic output terminal, and becomes conductive when the first logic output potential is at the first level, a fourth switch element which is connected between the intermediate node and the control node, has a control terminal which is connected to the second logic output node, and becomes conductive when the second logic output potential is at the first level, and a fifth switch element which is connected between a second power supply potential capable of bringing the first switching means and the second switching means into the cutoff state and the intermediate node, is held in the nonconductive state when the second switch element becomes conductive, and becomes conductive when the second switch element is held in the nonconductive state.

25. A differential sense amplifier circuit as set forth in claim 21, wherein the first switch element of the first setting means includes a charge effect transistor of an n-channel with a gate which is connected to the input terminal of the control signal.

26. A differential sense amplifier circuit as set forth in claim 21, wherein the first switch element of the first setting means includes a charge effect transistor of a p-channel with a gate which is connected to the input terminal of the control signal.

27. A differential sense amplifier circuit as set forth in claim 22, wherein the second switch element of the first setting means includes a charge effect transistor of an n-channel with a gate which is connected to the input terminal of the control signal.

28. A differential sense amplifier circuit as set forth in claim 22, wherein the second switch element of the first setting means includes a charge effect transistor of a p-channel with a gate which is connected to the input terminal of the control signal.

29. A differential sense amplifier circuit as set forth in claim 23, wherein the first switch element of the first setting means includes a charge effect transistor of a p-channel with a gate which is connected to the input terminal of the control signal.

30. A differential sense amplifier circuit as set forth in claim 24, wherein the second switch element of the first setting means includes a charge effect transistor of a p-channel with a gate which is connected to the input terminal of the control signal.

31. A differential sense amplifier circuit as set forth in claim 19, wherein the connection controlling means outputs a completion signal indicating the logic has been defined from the control node.

32. A differential sense amplifier circuit as set forth in claim 20, wherein the connection controlling means outputs a completion signal indicating the logic has been defined from the control node.

33. A differential sense amplifier circuit as set forth in claim 21, wherein the connection controlling means outputs a completion signal indicating the logic has been defined from the control node.

34. A differential sense amplifier circuit as set forth in claim 25, wherein the connection controlling means outputs a completion signal indicating the logic has been defined from the control node.

35. A differential sense amplifier circuit as set forth in claim 26, wherein the connection controlling means outputs a completion signal indicating the logic has been defined from the control node.

36. A differential sense amplifier circuit as set forth in claim 29, wherein the connection controlling means outputs a completion signal indicating the logic has been defined from the control node.

37. A differential sense amplifier circuit alternating between two phases of an idle phase and a working phase according to a control signal, comprising:

a first logic input terminal, a second logic input terminal, a first logic output terminal, a second logio output terminal, a sense amplifier which has a first inverter, and a second inverter, in which the output of the first inverter and the input of the second inverter are connected, the connection point thereof is connected to the first logic output terminal, the input of the first inverter and the output of the second inverter are connected, and the connection point thereof is connected to the second logic output terminal, and which operates upon receipt of a control signal indicating the working phase to define logic potentials of the first logic output and the second logic output at a different first level and second level according to the difference of conduction resistances possessed by the first logic input and the second logic input, an initializing means for connecting the input of the first inverter and the input of the second inverter upon receipt of a control signal indicating the idle phase, a first switching means for electrically connecting or cutting off the first logic input terminal and the first logic output terminal according to the potential of the control terminal, a second switching means for electrically connecting or cutting off the second logic input terminal and the second logic output terminal according to the potential of the control terminal, and a connection controlling means which has a first setting means for setting the potential of the control node connected to the control terminals of the first switching means and the second switching means to a potential that at least can connect two terminals to which the first and second switching means are connected upon receipt of at least one of the potentials of the first logic output terminal and the second logic output terminal at the time of the idle phase, and a second setting means for setting the potential of the control node to a potential that at least can cut off the two terminals to which the first and second switching means are connected according to the potential of the first logic output terminal or the second logic output terminal at the time of the working phase.

38. A differential sense amplifier circuit as set forth in claim 37, wherein the initializing means includes a first switch element which is connected between the input of the first inverter and the input of the second inverter and becomes conductive upon receipt of a control signal indicating the idle phase at its control terminal.

39. A differential sense amplifier circuit as set forth in claim 37, wherein:

the first setting means of the connection controlling means includes a first switch element and a second switch element which are connected in series between a first power supply potential capable of bringing the first switching means and the second switching means into the connection state and the control node and become conductive by receiving the potential of the first logic output terminal and the potential of the second logic output terminal at the time of the idle phase at their control terminals and the second setting means includes a third switch element which is connected between a second power supply potential capable of bringing the first switching means and the second switching means into the cutoff state and the control node, has a control terminal which is connected to the first logic output terminal, and becomes conductive when the first logic output potential is at the first level, and a fourth switch element which is connected between the second power supply potential and the control node, has a control terminal which is connected to the second logic output terminal, and becomes conductive when the second logic output potential is at the first level.

40. A differential sense amplifier circuit as set forth in claim 38, wherein the first setting means of the connection controlling means includes a second switch element and a third switch element which are connected in series between a first power supply potential capable of bringing the first switching means and the second switching means into the connection state and the control node and become conductive by receiving the potential of the first logic output terminal and the potential of the second logic output terminal at the time of the idle phase at their control terminals and the second setting means includes a fourth switch element which is connected between a second power supply potential capable of bringing the first switching means and the second switching means into the cutoff state and the control node, has a control terminal which is connected to the first logic output terminal, and becomes conductive when the first logic output potential is at the first level, and a fifth switch element which is connected between the second power supply potential and the control node, has a control terminal which is connected to the second logic output terminal, and becomes conductive when the second logic output potential is at the first level.

41. A differential sense amplifier circuit as set forth in claim 39, wherein the first and the second switch elements of the first setting means each include a charge effect transistor of a p-channel with a gate which is connected to the input terminal of the control signal.

42. A differential sense amplifier circuit as set forth in claim 40, wherein the second and third switch elements of the first setting means each include a charge effect transistor of a p-channel with a gate which is connected to the input terminal of the control signal.

43. A differential sense amplifier circuit as set forth in claim 37, wherein the connection controlling means outputs a completion signal indicating the logic has been defined from the control node.

44. A differential sense amplifier circuit as set forth in claim 38, wherein the connection controlling means outputs a completion signal indicating the logic has been defined from the control node.

45. A differential sense amplifier circuit as set forth in claim 39, wherein the connection controlling means outputs a completion signal indicating the logic has been defined from the control node.

46. A differential sense amplifier circuit as set forth in claim 40, wherein the connection controlling means outputs a completion signal indicating the logic has been defined from the control node.

47. A differential sense amplifier circuit as set forth in claim 41, wherein the connection controlling means outputs a completion signal indicating the logic has been defined from the control node.

48. A dynamic logical circuit alternating between two phases of an idle phase and a working phase according to a control signal, comprising:

a differential sense amplifier circuit having a first logic input terminal, a second logic input terminal, a first logic output terminal, a second logic output terminal, a sense amplifier which has a first inverter, and a second inverter, in which the output of the first inverter and the input of the second inverter are connected, the connection point thereof is connected to the first logic output terminal, the input of the first inverter and the output of the second inverter are connected, and the connection point thereof is connected to the second logic output terminal and which operates upon receipt of a control signal indicating the working phase to define logic potentials of the first logic output and the second logic output at a different first level and second level according to the difference of conduction resistances possessed by the first logic input and the second logic input, an initializing means for initializing the first logic input terminal and the second logic input terminal at a reference potential upon receipt of a control signal indicating the idle phase, a first switching means for electrically connecting or cutting off the first logic input terminal and the first logic output terminal according to the potential of the control terminal, a second switching means for electrically connecting or cutting off the second logic input terminal and the second logic output terminal according to the potential of the control terminal, and a connection controlling means which has a first setting means for setting the potential of the control node connected to the control terminals of the first switching means and the second switching means to a potential that at least can connect two terminals to which the first and second switching means are connected upon receipt of a control signal indicating the idle phase, and a second setting means for setting the potential of the control node to a potential that at least can out off the two terminals to which the first and second switching means are connected according to the potential of the first logic output terminal or the second logic output terminal at the time of the working phase, and a two rail type logic tree having two rails connected to the first logic input terminal and the second logic input terminal of the differential sense amplifier circuit, in which only one rail forms a route reaching the reference potential according to an input signal.

49. A dynamic logical circuit alternating between two phases of an idle phase and a working phase according to a control signal, comprising:

a differential sense amplifier circuit having a first logic input terminal, a second logic input terminal, a first logic output terminal, a second logic output terminal, a sense amplifier which has a first inverter, and a second inverter, in which the output of the first inverter and the input of the second inverter are connected, the connection point thereof is connected to the first logic output terminal, the input of the first inverter and the output of the second inverter are connected, and the connection point thereof is connected to the second logic output terminal and which operates upon receipt of a control signal indicating the working phase to define logic potentials of the first logic output and the second logic output at a different first level and second level according to the difference of conduction resistances possessed by the first logic input and the second logic input, an initializing means for connecting the input of the first inverter and the input of the second inverter upon receipt of a control signal indicating the idle phase, a first switching means for electrically connecting or cutting off the first logic input terminal and the first logic output terminal according to the potential of the control terminal, a second switching means for electrically connecting or cutting off the second logic input terminal and the second logic output terminal according to the potential of the control terminal, and a connection controlling means which has a first setting means for setting the potential of the control node connected to the control terminals of the first switching means and the second switching means to a potential that at least can connect two terminals to which the first and second switching means are connected upon receipt of a control signal indicating the idle phase, and a second setting means for setting the potential of the control node to a potential that at least can cut off the two terminals to which the first and second switching means are connected according to the potential of the first logic output terminal or the second logic output terminal at the time of the working phase, and a two rail type logic tree having two rails connected to the first logic input terminal and the second logic input terminal of the differential sense amplifier circuit, in which only one rail forms a route reaching the reference potential according to an input signal.

50. A dynamic logical circuit alternating between two phases of an idle phase and a working phase according to a control signal, comprising:

a differential sense amplifier circuit having a first logic input terminal, a second logic input terminal, a first logic output terminal, a second logic output terminal, a sense amplifier which has a first inverter, and a second inverter, in which the output of the first inverter and the input of the second inverter are connected, the connection point thereof is connected to the first logic output terminal, the input of the first inverter and the output of the second inverter are connected, and the connection point thereof is connected to the second logic output terminal and which operates upon receipt of a control signal indicating the working phase to define logic potentials of the first logic output and the second logic output at a different first level and second level according to the difference of conduction resistances possessed by the first logic input and the second logic input, an initializing means for connecting the input of the first inverter and the input of the second inverter upon receipt of a control signal indicating the idle phase, a first switching means for electrically connecting or cutting off the first logic input terminal and the first logic output terminal according to the potential of the control terminal, a second switching means for electrically connecting or cutting off the second logic input terminal and the second logic output terminal according to the potential of the control terminal, and a connection controlling means which has a first setting means for setting the potential of the control node connected to the control terminals of the first switching means and the second switching means to a potential that at least can connect two terminals to which the first and second switching means are connected upon receipt of at least one of the potentials of the first logic output terminal and the second logic output terminal at the time of the idle phase, and a second setting means for setting the potential of the control node to a potential that at least can cut off the two terminals to which the first and second switching means are connected according to the potential of the first logic output terminal or the second logic output terminal at the time of the working phase, and a two rail type logic tree having two rails connected to the first logic input terminal and the second logic input terminal of the differential sense amplifier circuit, in which only one rail forms a route reaching the reference potential according to an input signal.

* * * * *

UNITED STATES PATENT AND TRADEMARK OFFICE
CERTIFICATE OF CORRECTION

PATENT NO.   : 6,232,800 B1
DATED        : May 15, 2001
INVENTOR(S)  : Koji Hirairi It is certified that error appears in the above-identified patent and that said Letters Patent is hereby corrected as shown below:

<u>Column 28,</u>
Line 36, delete "a cut off." and insert therefore -- can cut off --.

Signed and Sealed this

Eleventh Day of March, 2003

JAMES E. ROGAN
*Director of the United States Patent and Trademark Office*